United States Patent
Suganuma et al.

(10) Patent No.: US 8,177,330 B2
(45) Date of Patent: May 15, 2012

(54) LIQUID DISCHARGE HEAD, INK JET RECORDING HEAD AND INK JET RECORDING APPARATUS

(75) Inventors: Takatoshi Suganuma, Yokohama (JP); Yasutomo Watanabe, Hiratsuka (JP); Toshiaki Hirosawa, Hiratsuka (JP); Shuzo Iwanaga, Kawasaki (JP); Akira Yamamoto, Yokohama (JP); Yasuhiko Osaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 992 days.

(21) Appl. No.: 11/909,897

(22) PCT Filed: Apr. 17, 2006

(86) PCT No.: PCT/JP2006/308482
§ 371 (c)(1),
(2), (4) Date: Sep. 27, 2007

(87) PCT Pub. No.: WO2006/112526
PCT Pub. Date: Oct. 26, 2006

(65) Prior Publication Data
US 2009/0267994 A1 Oct. 29, 2009

(30) Foreign Application Priority Data

Apr. 18, 2005 (JP) .................................. 2005-119556
Mar. 29, 2006 (JP) .................................. 2006-091012

(51) Int. Cl.
*B41J 2/14* (2006.01)
(52) U.S. Cl. ........................................................ 347/50
(58) Field of Classification Search ....................... 347/50
See application file for complete search history.

(56) References Cited

U.S. PATENT DOCUMENTS

| | | | |
|---|---|---|---|
| 5,479,197 | A | 12/1995 | Fujikawa et al. |
| 6,123,410 | A | 9/2000 | Beerling et al. |
| 6,188,414 | B1 | 2/2001 | Wong et al. |
| 6,250,738 | B1 | 6/2001 | Waller et al. |
| 6,322,206 | B1 | 11/2001 | Boyd et al. |
| 6,325,488 | B1 | 12/2001 | Beerling et al. |
| 6,341,845 | B1 | 1/2002 | Scheffelin et al. |
| 6,350,013 | B1 | 2/2002 | Scheffelin et al. |
| 6,428,145 | B1 | 8/2002 | Feinn et al. |
| 6,450,614 | B1 | 9/2002 | Scheffelin et al. |
| 6,454,955 | B1 | 9/2002 | Beerling et al. |
| 6,464,333 | B1 | 10/2002 | Scheffelin et al. |
| 6,543,880 | B1 | 4/2003 | Akhavain et al. |

(Continued)

FOREIGN PATENT DOCUMENTS

EP 0 913 261 A2 5/1999

(Continued)

OTHER PUBLICATIONS

Communication and European Search Report dated Feb. 16, 2012, in European Application No. 06732240.4.

*Primary Examiner* — Jerry Rahll
(74) *Attorney, Agent, or Firm* — Fitzpatrick, Cella, Harper & Scinto

(57) ABSTRACT

The invention provides an ink jet recording head, in which, for improving heat-dissipating property and electrode terminal connectivity and reducing production cost, second electrode terminals provided on a supporting surface of plural laminated sheets for supporting a liquid discharge substrate and to be connected with first electrode terminals of the liquid discharge substrate are provided outside an ink supply aperture formed in an outermost sheet constituting the supporting surface, and are supported by the outermost sheet and at least a sheet laminated thereunder.

8 Claims, 15 Drawing Sheets

U.S. PATENT DOCUMENTS

| | | |
|---|---|---|
| 6,592,205 B2 | 7/2003 | Beerling et al. |
| 6,648,437 B2 | 11/2003 | Kawamura et al. |
| 6,705,705 B2 | 3/2004 | Horvath et al. |
| 6,733,112 B2 | 5/2004 | Scheffelin et al. |
| 6,789,878 B2 | 9/2004 | Scheffelin et al. |
| 2003/0058308 A1 | 3/2003 | Yamamoto |

FOREIGN PATENT DOCUMENTS

| | | |
|---|---|---|
| JP | 5-177836 | 7/1993 |
| JP | 9-70971 | 3/1997 |
| JP | 9-207346 | 8/1997 |
| JP | 11-192705 | 7/1999 |
| JP | 2002-86742 | 3/2002 |
| JP | 2004-71597 | 3/2004 |

F—F' SECTION

G—G' SECTION

US 8,177,330 B2

LIQUID DISCHARGE HEAD, INK JET RECORDING HEAD AND INK JET RECORDING APPARATUS

FIELD OF THE INVENTION

The present invention relates to a recording apparatus for conducting a recording operation by discharging a recording liquid such as ink (hereinafter collectively called "ink"), a recording head adapted for use in such recording apparatus, and a liquid discharge head for discharging a liquid such as a chemical liquid.

BACKGROUND ART

In a recording head to be mounted in an ink jet recording apparatus, a representative ink discharge method is a method utilizing an electrothermal converting element. In this method, an electrothermal converting element is provided in a liquid chamber and is given an electrical pulse as a recording signal to supply a recording liquid with thermal energy, and a pressure of a bubble generated in the recording liquid by a phase change therein is utilized for discharging a droplet of the recording liquid. Such ink jet recording head includes a liquid discharge substrate which discharges a droplet of a recording liquid and an ink supply system for supplying the liquid discharge substrate with the ink.

The liquid discharge substrate is provided with a device substrate having electrothermal converting elements and liquid discharge ports in plural pairs, and a flow path forming member which is laminated on the device substrate to define a space enclosing each electrothermal converting element, and a discharge port for the recording liquid droplet and an ink supply path, communicating with each space. The liquid discharge substrate is supported by a support member having a liquid supply opening, and electrode lead terminals of an electric wiring board, which supplies the liquid discharge substrate with an electrical drive signal and a driving power, are electrically connected with electrodes formed on a surface of the liquid discharge substrate, at the side of the discharge ports.

Recently the ink jet recording apparatuses are experiencing a significant price erosion, so that the manufacture of the ink jet recording head as inexpensively as possible is becoming a major issue. For this purpose, a dimensional reduction of the liquid discharge substrate is particularly effective. A smaller size of the liquid discharge substrate allows to obtain a larger number thereof from a single wafer, thus enabling a cost reduction of the recording head.

However, a dimensional reduction in the liquid discharge substrate of the above-described structure results in following drawbacks.

With the liquid discharge substrate made smaller in size, an adjoining area of the liquid discharge substrate to the support member becomes smaller while the number of the electrothermal converting elements remains unchanged, so that the heat generated by the electrothermal converting elements in the driven state tends to be accumulated in the device substrate. As a result, the discharge control utilizing the bubble generation in the liquid may be detrimentally affected. Therefore, in order to dissipate such heat efficiently from the liquid discharge substrate, the supporting member has to be given a high heat dissipating property.

Also with the liquid discharge substrate made smaller in dimension, the connecting parts of the electrode terminals for supplying the electric power and the drive signal become smaller in size and pitch, whereby the connectivity becomes difficult to secure. It therefore becomes difficult to form, as in the liquid discharge substrate of prior art, the electrodes to be connected with the electrode terminals for supplying the electric power and the drive signal, on the surface of the substrate.

As a prior recording head capable of solving the issue of connectivity, patent reference 1 discloses a printing head bearing electrical connecting electrodes on a surface opposite to the surface bearing the discharge ports.

FIG. 26 is a partial cross-sectional view, including a printing head die and a supporting substrate and showing the structure for electrical connection in an ink jet printing head disclosed in Japanese Patent Application Laid-open No. 11-192705.

Referring to FIG. 26, a print head 218 is mounted on a supporting substrate 220. The print head 218 has electrodes 284 for electrical connection and an ink supply opening 242 on a surface opposite to the surface including a discharge nozzle aperture 238. The supporting substrate 220 for supporting the print head 218 is provided with electrical wirings on a first surface 270 and on a second surface 272. The print head 218 is electrically connected and supported, by solder bumps, on the first surface 270 of the supporting substrate 220. A logic circuit (not shown) and a drive circuit 230 are provided on the second surface 272, opposite to the first surface 270 of the supporting substrate 220.

Also as a prior example of the supporting substrate for supporting the liquid discharge substrates, Japanese Patent Application Laid-open No. 2002-86742 discloses a carrier for a purpose of precisely aligning plural liquid discharge substrates. The carrier includes a substrate formed by plural layers, and a mounting layer laminated on the substrate and serving to mount the liquid discharge substrate, and the purpose is attained by planarizing a surface of the mounting layer, opposite to the substrate. The mounting layer constituting such supporting substrate, called a carrier, is provided with an opening, which communicates with the ink supply opening of the liquid discharge substrate mounted on the mounting layer. Also the substrate bearing the mounting layer is provided with an opening penetrating through the layers constituting the substrate, and such opening communicates, as an ink flow path, with the opening of the mounting layer. Also in order to supply the liquid discharge substrate with an electrical signal, the carrier is provided with an electrically conductive path penetrating through the layers of the substrate, from the rear surface to the top surface of the carrier. The carrier is provided, on the surface thereof, with an electrode pad constituting a terminal part of the conductive path. Such electrode pad is electrically connected, by a bonding wire, with an electrode formed on a surface, including the discharge port, of the liquid discharge substrate.

However, the structure of the print head (liquid discharge substrate) and the supporting substrate, disclosed in Japanese Patent Application Laid-open No. 11-192705, involves following drawbacks.

The supporting substrate for supporting the liquid discharge substrate, being formed by a one-layered substrate, has a limited heat capacity and is unable to efficiently absorb the heat, generated when the electrothermal converting element on the liquid discharge substrate is activated, by the supporting substrate, thus being poor in the heat dissipating property.

Also in case of forming solder bumps on the electrodes on the rear surface of the liquid discharge substrate as shown in FIG. 26 and connecting the liquid discharge substrate on the supporting substrate under a predetermined load on such bumps, there may result a deformation of the supporting substrate or a defective connection of the electrode terminal.

More specifically, as shown in FIG. 26, the print head has the ink supply opening 242 on a surface thereof opposed to the supporting substrate 220, and solder bumps are formed on rear electrodes 284 formed on a rim portion of the ink supply opening 242. On the other hand, the supporting substrate 242 is provided with an opening communicating with the ink supply opening 242 of the print head, and electrodes are formed on the rim portion of such opening for connection with the solder bumps. The supporting substrate 220 is not supported under the rim portion of the opening, to be connected with the solder bumps, and may therefore be deformed at the connection with the solder bumps, thereby deteriorating the connectivity of the solder bumps.

Particularly in case of forming a penetrating electrode from the top surface to the rear surface of the supporting substrate, such supporting substrate is usually prepared thinner, as a long penetrating electrode requires an elevated production cost. For this reason, in case the supporting substrate is not supported under a portion to be connected with the solder bump as disclosed in Japanese Patent Application Laid-open No. H11-192705, it shows a deficient strength in supporting and connecting the liquid discharge substrate, resulting in a deformation of the supporting member or a connection failure in the electrode terminals.

Also in the recording head structure shown in Japanese Patent Application Laid-open No. 2002-86742, electrodes on a surface, including the discharge port, of the liquid discharge substrate and electrode pads of the supporting substrate on the surface thereof mounting the liquid discharge substrate are connected electrically by bonding wires. Therefore, when the pitch of the electrodes is made smaller by a dimensional reduction in the liquid discharge substrate, connection with such bonding wires becomes difficult to achieve. Also Japanese Patent Application Laid-open No. 2002-86742 does not cover the aspect of improving the heat dissipating property in the structure of the supporting substrate.

DISCLOSURE OF THE INVENTION

An object of the present invention is to provide a liquid discharge head, an ink jet recording head and an ink jet recording apparatus, capable of achieving an improvement in the heat dissipating property, an improvement in the electrode terminal connectivity and a reduction in the manufacturing cost.

Another object of the present invention is to provide a liquid discharge head including a liquid discharge substrate, containing a liquid supply opening for supplying a liquid, a discharge port for discharging the liquid supplied from the liquid supply opening, discharge energy generating means which generates an energy for discharging the liquid, and a first electrode terminal for supplying the discharge energy generating means with an electric power and a drive signal, a support member which has a support surface for supporting the liquid discharge substrate, which includes a second electrode terminal provided on the support surface and to be connected with the first electrode terminal and a liquid supply hole for supplying the liquid supply opening of the liquid discharge substrate with a recording liquid, and which is formed by laminating plural sheet members including an aperture for forming the liquid supply hole, a conductive wiring and a via hole, and an internally structured electrical wiring formed by the conductive wiring and the via hole in the interior of the support member and electrically connected to the second electrode terminal on the support surface for the liquid discharge substrate, wherein the second electrode terminal is positioned outside the aperture provided on an outermost sheet member of the support member constituting the supporting surface for the liquid discharge substrate and is supported by at least a sheet member laminated with the outermost sheet member.

BEST MODE FOR CARRYING OUT THE INVENTION

In the following, embodiments of the present invention will be explained with reference to the accompanying drawings. In the following description, the liquid discharge head of the present invention will be represented by an ink jet recording head for discharging an ink as the liquid.

(Embodiment 1)

Figure 1:
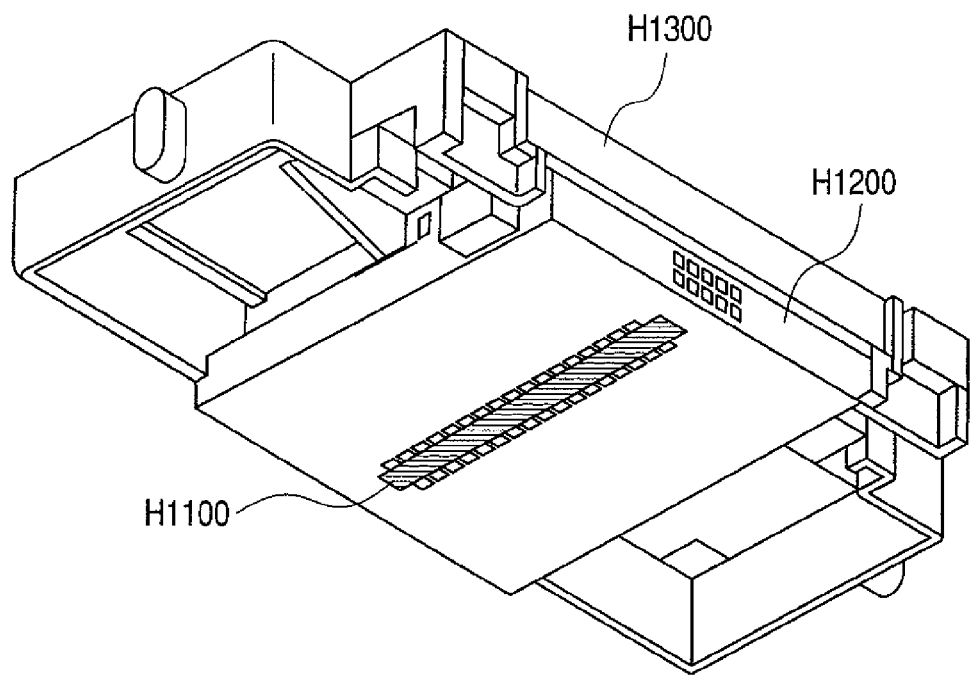
FIG. 1 is an external perspective view of a recording head in an embodiment 1 of the present invention.
Figure 2:
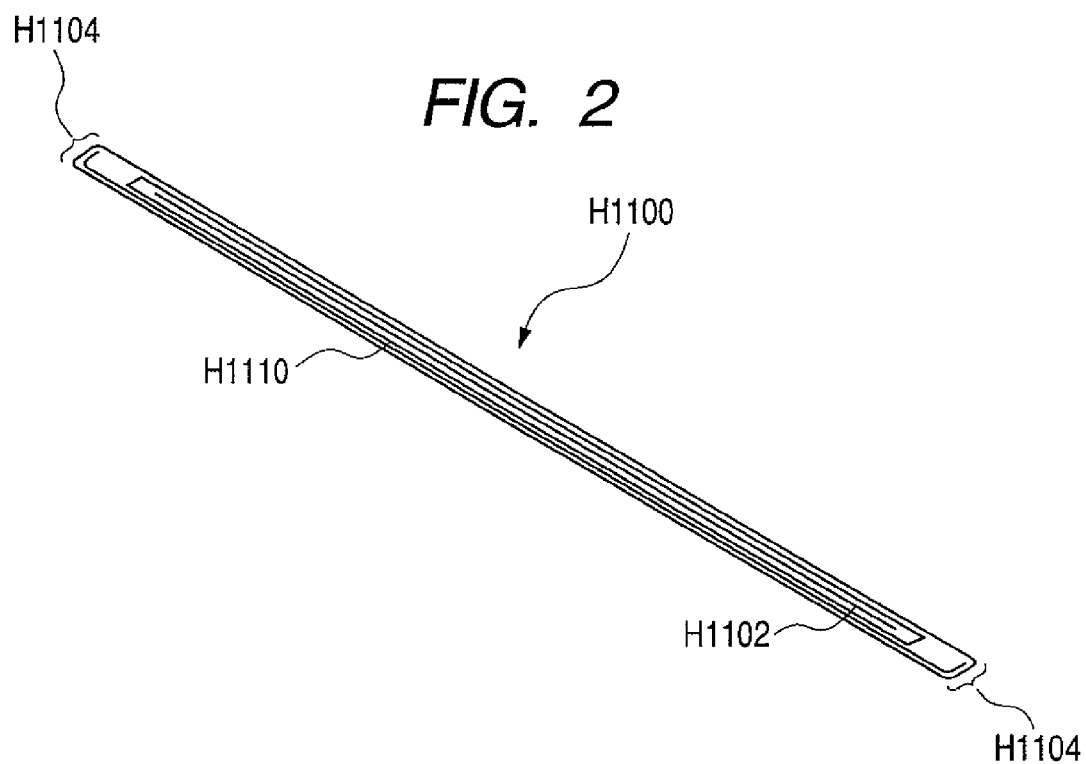
FIG. 2 is a schematic perspective view of a liquid discharge substrate to be employed in the recording head shown in FIG. 1.
Figure 3:
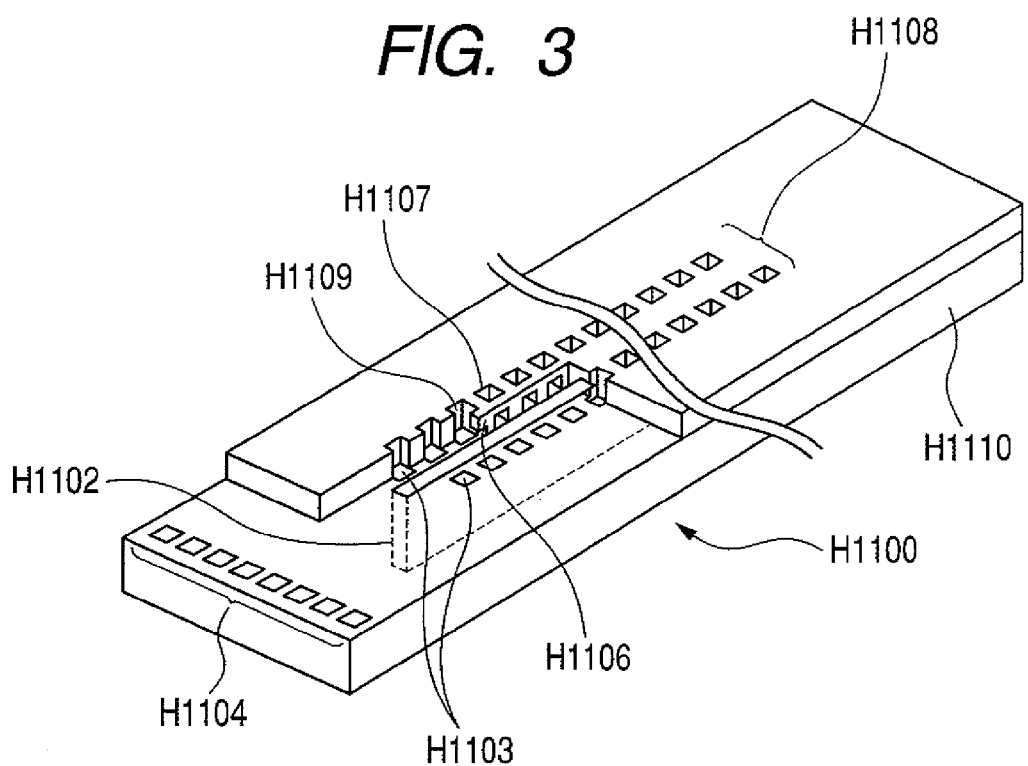
FIG. 3 is a partial magnified perspective view of the liquid discharge substrate shown in FIG. 2.
Figure 4:
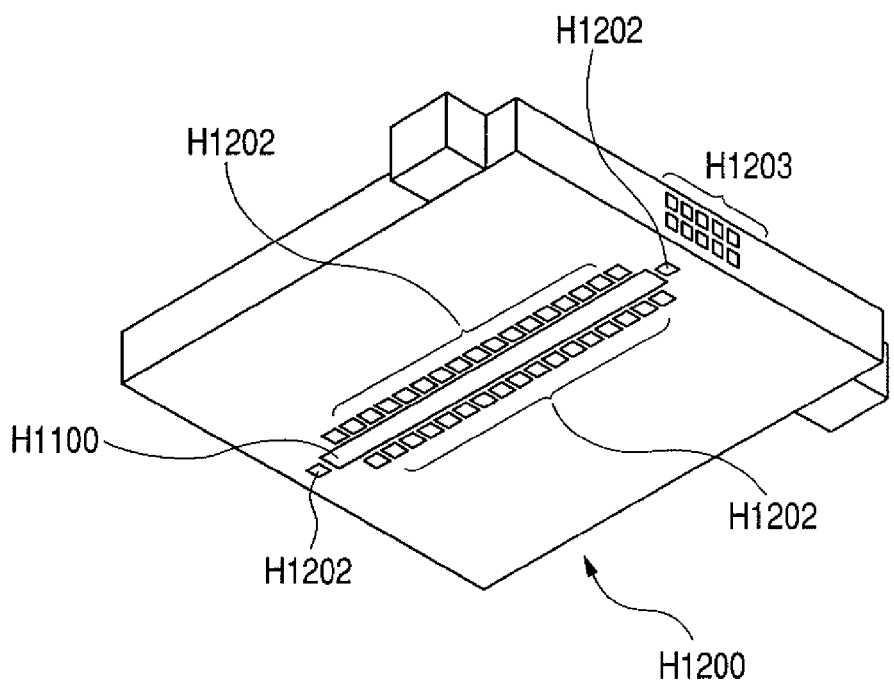
FIG. 4 is an external perspective view of a support member with an internally structured wiring.

FIG. 1 is an external perspective view of a recording head constituting the embodiment 1 of the present invention; FIG. 2 is a schematic perspective view of a liquid discharge substrate to be employed in the recording head shown in FIG. 1; FIG. 3 is a partial magnified perspective view of the liquid discharge substrate shown in FIG. 2; FIG. 4 is an external perspective view of a support member with an internally structured wiring (support member with an internally structured electrical wiring, formed by a ceramic green sheet method); and FIG. 5 is an external perspective view showing a state in which the liquid discharge substrate shown in FIG. 2 is provided on the support member with internally structured wiring shown in FIG. 4.

Figure 5:
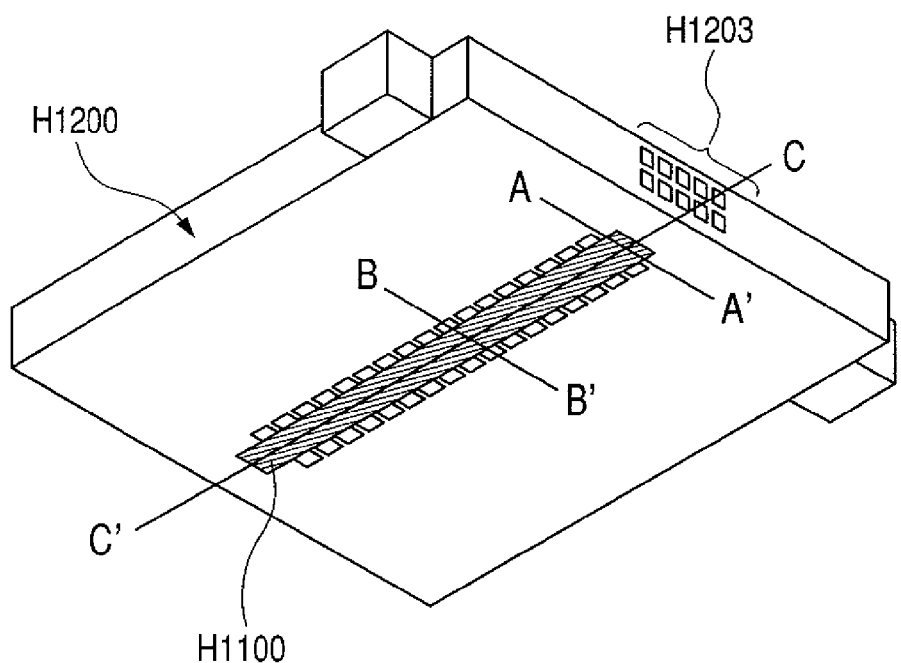
FIG. 5 is an external perspective view showing a state in which the liquid discharge substrate shown in FIG. 2 is provided on the support member with internally structured wiring shown in FIG. 4.
Figure 6:
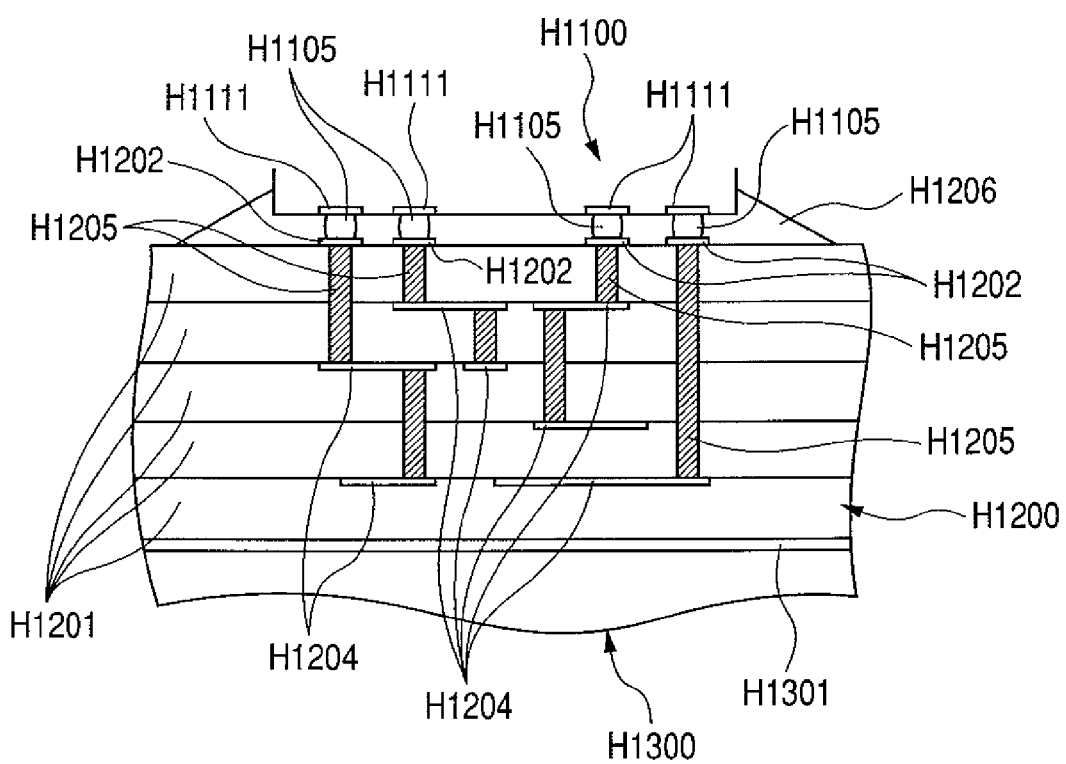
FIG. 6 is a schematic cross-sectional view along a line A-A' in FIG. 5, showing the support member with internally structured wiring in a vicinity of an electrode for supplying the liquid discharge substrate with a driving electric power.
Figure 7:
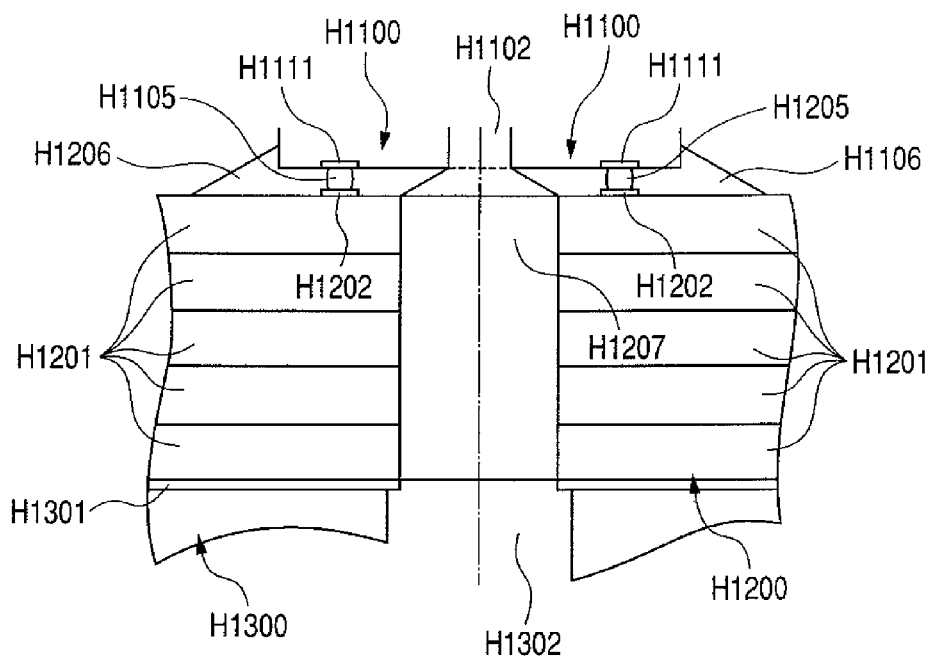
FIG. 7 is a schematic cross-sectional view along a line B-B' in FIG. 5, showing the support member with internally structured wiring in a vicinity of a liquid supply opening for supplying the liquid discharge substrate with a recording liquid.
Figure 8:
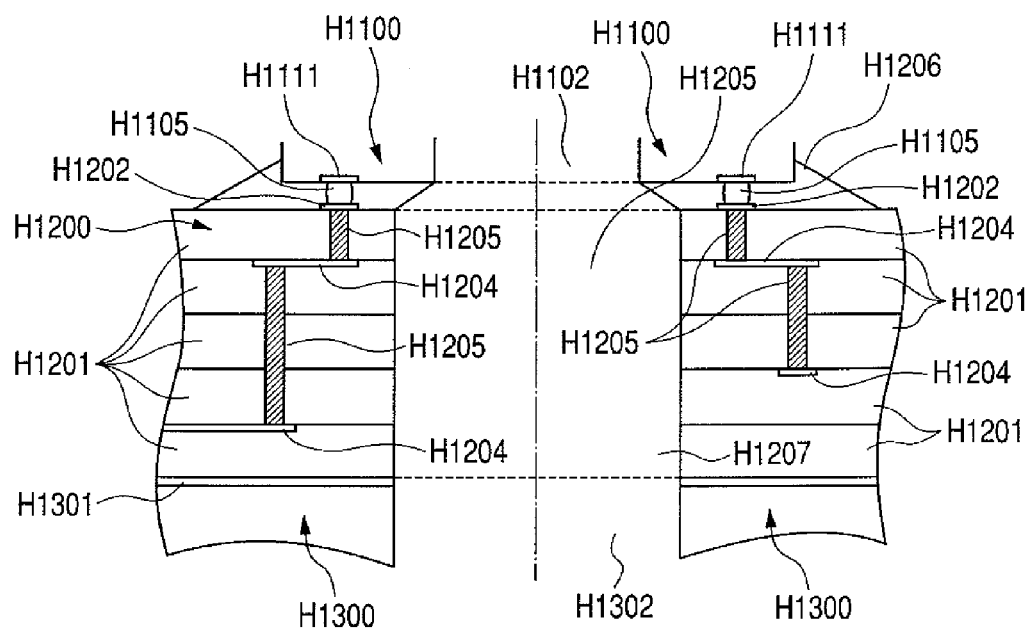
FIG. 8 is a schematic cross-sectional view along a line C-C' in FIG. 5, showing the support member with internally structured wiring along the longitudinal direction of the liquid discharge substrate.

FIG. 6 is a schematic cross-sectional view along a line A-A' in FIG. 5, showing the support member with internally structured wiring in a vicinity of an electrode for supplying the liquid discharge substrate with a driving electric power; FIG. 7 is a schematic cross-sectional view along a line B-B' in FIG. 5, showing the support member with internally structured wiring in a vicinity of a liquid supply opening for supplying the liquid discharge substrate with a recording liquid; and FIG. 8 is a schematic cross-sectional view along a line C-C' in FIG. 5, showing the support member with internally structured wiring along the longitudinal direction of the liquid discharge substrate.

As illustrated in FIGS. 1 to 8, the ink jet recording head of the present embodiment is equipped with a support member H1200 having an internally structured wiring, and a liquid discharge substrate H1100 supported (mounted) on the support member H1200 having the internally structured wiring. The recording head is further provided with a recording liquid supply member H1300, adjoined with an adhesive H1301, to a side of the support member H1200 with internally structured wiring, opposite to the liquid discharge substrate H1100.

The recording head is fixedly supported by positioning means and electrical contacts, provided on a carriage (not shown) mounted in a main body of the ink jet recording apparatus. The carriage is rendered movable in a direction which crosses a conveying direction of a recording sheet. Further, the recording head is provided with a detachable ink tank (not shown), which can be replaced to a new tank when the ink in the ink tank is exhausted.

On the surface of the liquid discharge substrate H1100, as shown in FIGS. 2 and 3, discharge ports H1107 for discharging a recording liquid such as ink are opened in plural rows to constitute a discharge port array H1108. On the rear surface of the liquid discharge substrate H1100, a liquid supply opening H1102, for supplying the recording liquid, is opened over a length approximately equal to that of the discharge port array H1108. The recording liquid supplied from the liquid supply opening H1102 enters and is temporarily stored in a bubble generation chamber (liquid chamber) H1109. Then the recording liquid in the liquid chamber H1109 causes a bubble generation by an electrothermal converting element H1103 constituting discharge energy generation means, whereby the recording liquid is discharged from the discharge port H1107. In an end portion of the liquid discharge substrate H1100, plural electrodes H1104 are formed for transmitting electrical signals to the electrothermal converting elements H1103. The electrodes H1104 are connected, through unillustrated penetrating wirings, which penetrates through the liquid discharge substrate H1100, to rear surface electrode terminals H1111 (FIG. 6) formed on the rear surface of the liquid discharge substrate H1100.

Under the liquid discharge substrate H1100, there is provided a support member H1200 with internally structured wiring. The support member H1200 with internally structured wiring is constituted, as shown in FIGS. 6 to 8, by laminating ceramic sheets H1201. The support member H1200 with internally structured wiring is provided, on a surface thereof, with surface electrode terminals H1202 for supplying the liquid discharge substrate H1100 with drive signals, and, on a lateral face thereof, with lateral electrode terminals H1203 for receiving electrical signals from the main body (FIG. 4). These electrodes are mutually connected by internal conductive wirings H1204 and via holes H1205 filled with a conductive material, through the interior of the support member H1200 with internally structured wirings. The liquid discharge substrate H1100 and the support member H1200 with internally structured wiring are electrically connected by bumps H1105, and are sealed with a sealant (or adhesive) H1206 for protection of the electrical connections from an erosion by the recording liquid or from a mechanical impact.

Also, as shown in FIGS. 7 and 8, the support member H1200 with internally structured wiring has a liquid supply opening H1207 penetrating from the top surface to the rear surface. The recording liquid supply member H1300, adjoined to the support member H1200 with internally structured wirings, also has a liquid supply opening H1302. Thus, the liquid supply openings of these members are mutually adjoined whereby the recording liquid supplied from an ink tank (not shown) enters, through a filter (not shown) the recording liquid supply member H1300 and then enters, through the liquid supply opening H1302, the liquid supply opening H1207 of the support member H1200 with internally structured wirings. The recording liquid, then entering the liquid supply opening H1102 of the liquid discharge substrate H1100, is supplied to the bubble generating chamber H1109 thereof.

Such liquid discharge substrate H1100 of the present embodiment bears, on a surface of a silicon substrate H1110, a heat structure including the discharge port H1108 and the bubble generation chamber H1102 of a resinous material of a height of about 20 to 100 μm, and is mounted on the support member H1200. Such support member H1200 supports the liquid discharge substrate H1100 on a laminated structure of a ceramic sheet H1201 of a thickness of about 0.1 to 0.2 mm, in a state enabling an electrical conduction and an ink supply. The surface electrode terminals H1202 are positioned outside the liquid supply opening H1302, provided in an outermost ceramic sheet constituting a supporting surface of the support member H1200 for the liquid discharge substrate H1100. Also the surface electrode terminals H1202 are positioned outside the liquid supply opening H1302, provided in the outermost ceramic sheet H1201 and in at least another ceramic sheet H1201 laminated thereunder. Therefore, the electrical connecting part between the support member H1200 and the liquid discharge substrate H1100 is supported in an area where the thin ceramic sheet H1201, employed for facilitating the formation of a via hole H1205 for the penetrating electrode, is present in at least two layers. Therefore, in mounting the liquid discharge substrate H1100 on the support member H1200, a load acting on the connecting part between the surface electrode terminals in the liquid discharge substrate and the surface electrode terminals in the support member can be supported by the laminated structure of the ceramic sheets H1201.

The surface electrode terminals H1202 and the bumps H1105, provided on the support member H1200 with internally structured wirings as shown in FIGS. 6 to 8 in a portion thereof in contact with the liquid discharge substrate H1100, may be used for the purpose of transmitting electrical signals, or for the purpose of heat dissipation, for dissipating the heat, generated by in the liquid discharge substrate H1100 at the liquid discharge, to the support member with internally structured wirings.

A ceramic material to be employed in the support member H1200 with internally structured wiring may be any material which is chemically stable against the recording liquid, and is preferably capable of dissipating the heat generated in the liquid discharge substrate H1100 in the ink discharging operation. Examples of such material include alumina, aluminum nitride, murite or low-temperature calcined ceramics (LTCC). A wiring material to be employed in the support member H1200 with internally structured wirings may be any material showing an adhering property to the aforementioned ceramics, such as W, Mo, Pt, Au, Ag, Cu or Pd.

An electrical connecting portion between rear surface electrode terminals H1111 of the liquid discharge substrate H1100 and surface electrode terminals H1202 of the support member H1200 with internally structured wirings is sealed by a sealant (or adhesive) H1206, thereby being completely insulated from the recording liquid coming from the liquid supply opening H1207. Also the external periphery of the liquid supply opening H1102 of the liquid discharge substrate H1100 is completely closed by a sealant H1206 and separated from the external part of the liquid discharge substrate H1100, thereby avoiding an unnecessary leak of the recording liquid to the exterior.

Also in the present embodiment, the rear surface electrode terminals H1111 of the liquid discharge substrate H1100 and the surface electrode terminals H1202 of the support member H1200 with internally structured wirings may be adjoined by metal bumps such as gold bumps, or by an adjoining with a conductive adhesive material or by a pressurization of the electrodes utilizing a thermosetting adhesive. Also the thermosetting adhesive may contain conductive particles.

In the structure of the present embodiment, a liquid discharge substrate is mounted for a single recording head, and has a single discharge port array. Therefore, each liquid discharge substrate can record a single color only, but a multi-color recording becomes possible by employing plural liquid discharge substrates (see following embodiment 12). As a larger number of mounted liquid discharge substrates increases the generated heat amount, so that a recording head mounted on the support member including the internally structured wirings becomes more advantageous in the heat dissipating property.

(Embodiment 2)

Figure 9:
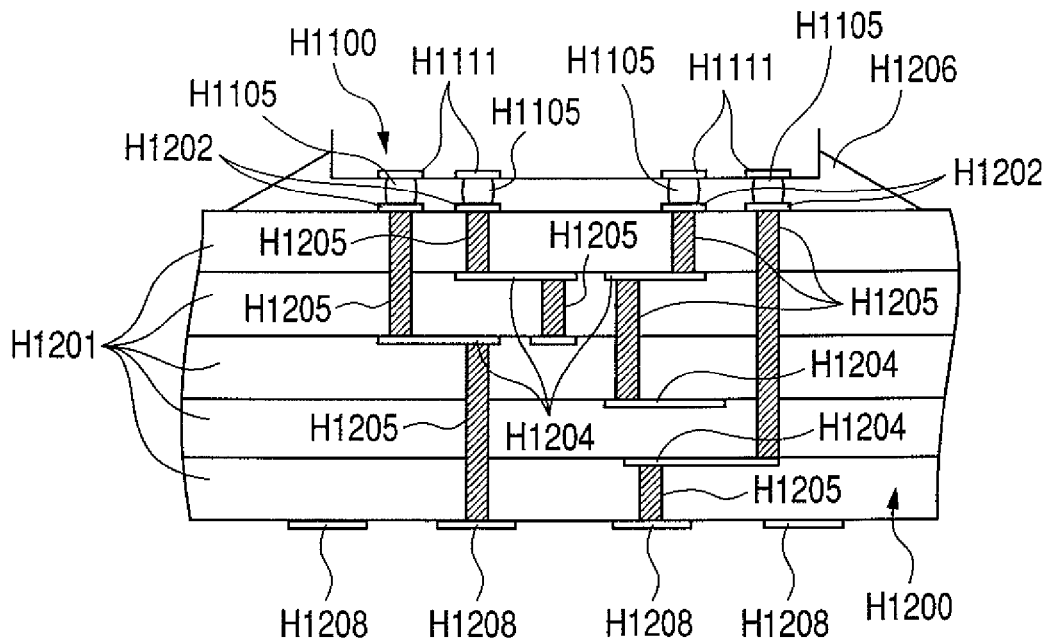
FIG. 9 illustrates an embodiment 2 of the recording head of the present invention, and is a cross-sectional view showing the support member with internally structured wiring in a vicinity of an electrode for supplying the liquid discharge substrate with a driving electric power.

FIG. 9 illustrates an embodiment 2 of the recording head of the present invention, and is a cross-sectional view showing the support member with internally structured wiring in a vicinity of an electrode for supplying the liquid discharge substrate with a driving electric power. FIG. 9 corresponds to a cross section along a line A-A' in FIG. 5.

The foregoing embodiment 1 has shown a structure in which the support member H1200 with internally structured wiring is provided, on a surface thereof, with surface electrode terminals H1202, and, on a lateral face thereof, with lateral electrode terminals H1203 for receiving electrical signals from the main body, and these electrodes are mutually connected by internal conductive wirings H1204 and via holes H1205, through the interior of the support member H1200 with internally structured wirings.

Instead of such structure, it is also possible to position terminals for drive signal input to be connected with the main body of the recording apparatus, as rear surface electrode terminals H1208 on a surface of the support member H1200 with internally structured wirings, opposite to the surface thereof supporting the liquid discharge substrate. Such structure allows to utilize pads of larger areas for connecting the support member H1200 with internally structured wirings and the main body of the apparatus, thus improving reliability of the adjoining and rendering the connection easier.

(Embodiment 3)

Figure 10:
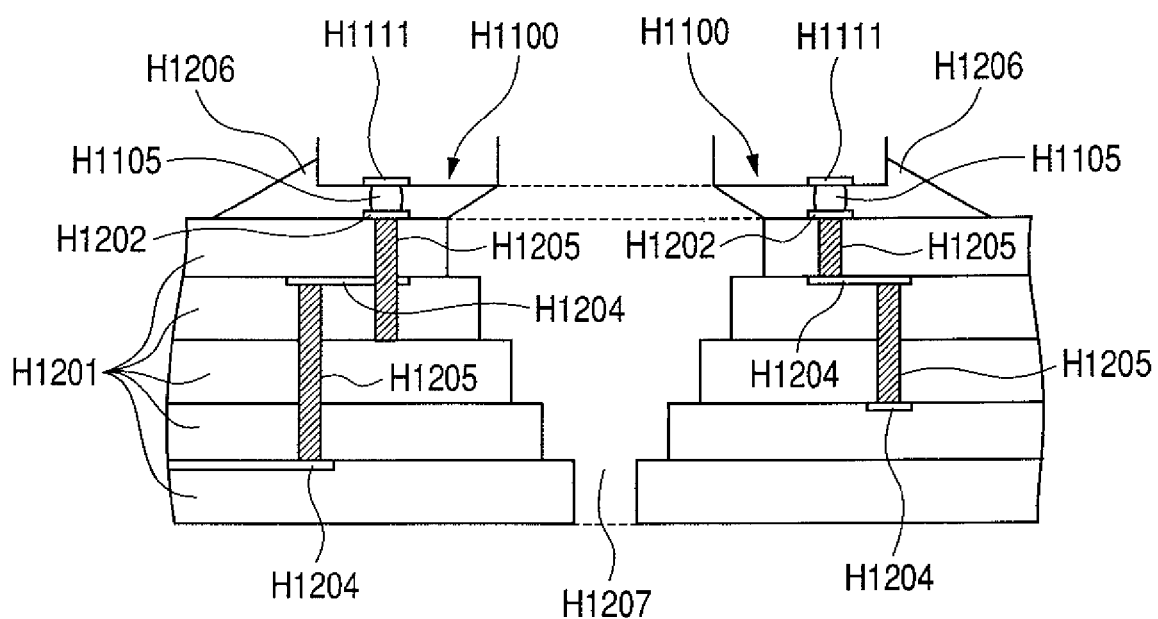
FIG. 10 illustrates an embodiment 3 of the recording head of the present invention, and is a cross-sectional view showing the support member with internally structured wiring along the longitudinal direction of the liquid discharge substrate.

FIG. 10 illustrates an embodiment 3 of the recording head of the present invention, and is a cross-sectional view showing the support member with internally structured wiring along the longitudinal direction of the liquid discharge substrate. FIG. 10 corresponds to a cross section along a line C-C' in FIG. 5.

The foregoing embodiment 1 shows a structure in which the liquid supply opening H1207, in the support member H1200 with internally structured wiring, remains constant in the direction of depth, as shown in FIG. 8.

It is also possible, as shown in FIG. 10, to change, in the direction of depth, the area of the liquid supply opening H1207, penetrating the support member H1200 with internally structured wiring from the top surface to the rear surface thereof and provided for supplying the liquid discharge substrate H1100 with the recording liquid. As shown in the cross-sectional view in FIG. 10, the liquid supply opening H1207 is formed in a stepwise shape. It can be formed by changing the area of aperture in each ceramic sheet H1201. Particularly in the present embodiment, a width of the aperture of the liquid supply opening H1207 is made narrower in succession, from the ceramic sheet H1201 at the outermost surface in the support member H1200 with internally structured wiring toward the lower layers.

(Embodiment 4)

Figure 11:
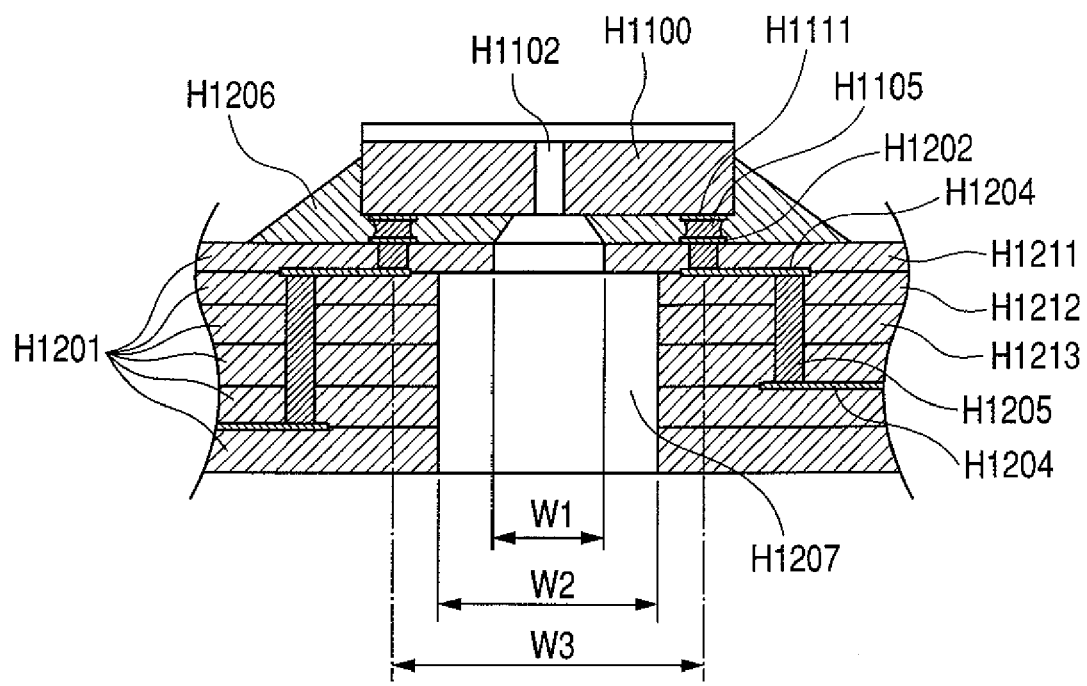
FIG. 11 illustrates an embodiment 4 of the recording head of the present invention, and is a cross-sectional view showing the support member with internally structured wiring in a vicinity of a liquid supply opening for supplying the liquid discharge substrate with a recording liquid.

FIG. 11 illustrates an embodiment 4 of the recording head of the present invention, and is a cross-sectional view showing the support member with internally structured wiring in a vicinity of a liquid supply opening for supplying the liquid discharge substrate with a recording liquid. FIG. 11 corresponds to a cross section along a line B-B' in FIG. 5.

Instead of the above-described embodiment 3, it is also possible, as shown in FIG. 11, in the support member H1200 with internally structured wiring, to precisely form only an aperture, formed in the outermost ceramic sheet H1201 coming into contact with the liquid discharge substrate H1100 and corresponding to a part of the liquid supply opening H1207. Stated differently, it is possible to form the apertures in the plural ceramic sheets H1201, positioned under the outermost layer, with a larger width than that of thus precisely formed aperture. Such structure provides an improved fluidity of the recording liquid and allows an exact supply of the recording liquid to the liquid discharge substrate H1100.

In the following, features of the present embodiment will be explained.

The outermost ceramic sheet H1201 of the support member H1200 with internally structured wiring, constituting a supporting surface for the liquid discharge substrate H1100, as shown in FIG. 11, will be called a first layer H1211. In the first layer H1211, the liquid supply opening is positioned more inside than a range, surrounded by the plural rear surface electrode terminals H1111 of the liquid discharge substrate H1100 and the corresponding surface electrode terminals H1202 of the support member connected by the bumps H1105 (hereinafter called electrode terminal connecting parts). In the cross-sectional view shown in FIG. 11, the width W1 of the liquid supply opening in the first layer H1211 is smaller than a distance W3 of the electrode terminal connecting parts.

Also in a second layer H1212, adjacent to the first layer H1211, aperture ends of the liquid supply opening are formed outside the liquid supply opening in the first layer H1211, but still more inside than the range surrounded by the plural electrode terminal connecting parts. Thus, in the cross-sectional view shown in FIG. 11, the width W2 of the liquid supply opening of the second layer H1212 is larger than the width W1 of the liquid supply opening of the first layer H1211, but is smaller than the width W3 between the electrode terminal connecting parts.

A third layer H1213 under the second layer H1212 has a liquid supply opening formed with a width same as that of the second layer H1212.

It is thus made possible to secure a wider area for protecting the electrode terminal connecting parts with the sealant H1206, by positioning the aperture ends of the liquid supply opening of the first layer H1211, constituting the supporting surface for the liquid discharge substrate, at more inside than the range surrounded by the electrode terminal connecting parts. Therefore, even when the liquid discharge substrate is made smaller, there can be improved the reliability of protection on the electrode terminal connecting parts from the recording liquid.

It is also possible to facilitate working of the liquid supply opening and to reduce the manufacturing cost, by forming the aperture ends of the liquid supply openings in the underlying layers outside those in the first layer H1211 constituting the supporting surface for the liquid discharge substrate, thereby increasing the width of the liquid supply openings in such underlying layers. Also the liquid supply opening made wider in the underlying layers can reduce the flow resistance for the recording liquid passing through the liquid supply opening, thereby improving the supply of the recording liquid. The effect is particularly conspicuous when the liquid discharge substrate is made smaller.

Also the electrode terminal connecting parts are positioned outside the liquid discharge opening in the layers underlying the first and second layers. Therefore, all the layers constituting the support member are positioned under the electrode terminal connecting parts, thereby securing planarity of the bump connecting surface of the support member and improving connectivity of the electrode terminals. Such feature is present also in other embodiments, such as that shown in FIGS. 7 and 8, and that shown in FIG. 10.

(Embodiment 5)

Figure 12:
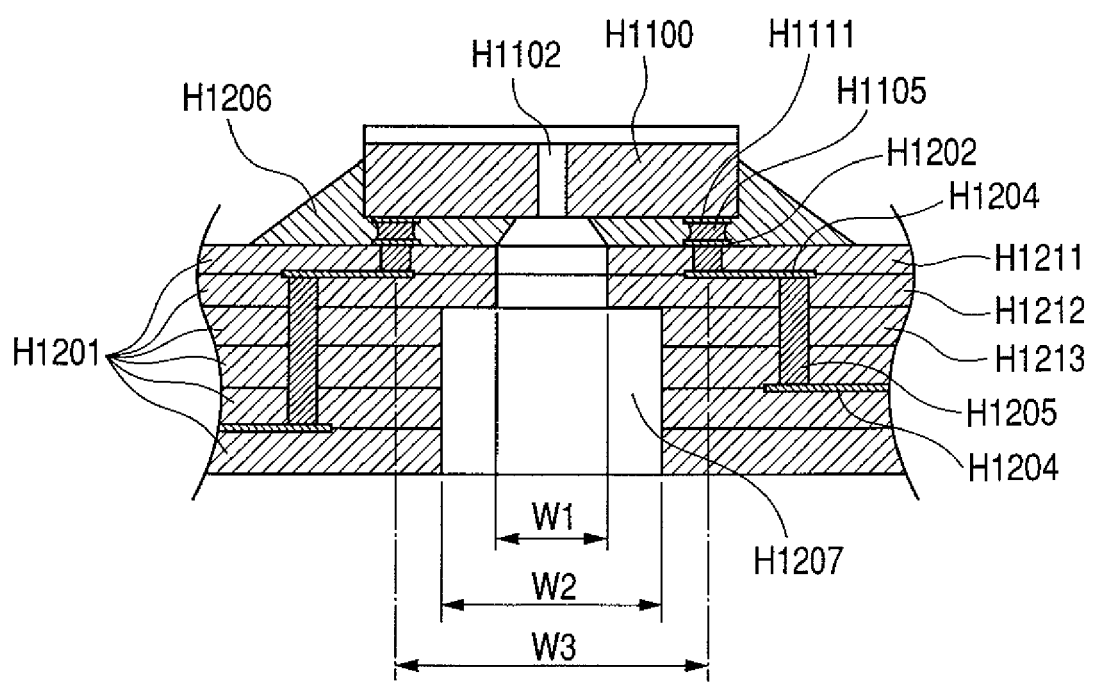
FIG. 12 illustrates an embodiment 5 of the recording head of the present invention, and is a cross-sectional view showing the support member with internally structured wiring in a vicinity of a liquid supply opening for supplying the liquid discharge substrate with a recording liquid.

FIG. 12 illustrates an embodiment 5 of the recording head of the present invention, and is a cross-sectional view showing the support member with internally structured wiring in a vicinity of a liquid supply opening for supplying the liquid discharge substrate with a recording liquid. FIG. 12 corresponds to a cross section along a line B-B' in FIG. 5.

In the foregoing embodiment 4, the aperture width of the liquid supply opening is made smaller in the uppermost green sheet H1201 of the support member with internally structured wiring and made larger in other underlying layers.

On the other hand, in the present embodiment, the aperture width of the liquid supply opening in the second layer H1212, adjacent to the first layer H1211, is made same as that in the first layer H1211.

In the embodiment 4, in case the ceramic sheet of the first layer H1211 of the support member H1200 has to be made thinner, the aperture end portions of the liquid supply opening of the first layer H1211, protruding beyond the aperture of the liquid supply opening of the second layer H1212, tend to may hang down. Such phenomenon occurs in the course of manufacture of the support member. Such hanging down may hinder the sealing process with the sealant H1206 and may result in a drawback that the sealant flows into the liquid supply opening.

Therefore, the aperture width of the liquid supply opening, made same in the uppermost two layers as in the present embodiment, increases the rigidity in this portion and avoids the hang-down phenomenon. Two layers are used in the present embodiment, but the number of the layers may be increased. As the rigidity is determined by the thickness of the ceramic sheets, it is possible to determine a hang-down amount not affecting the sealing operation, thereby determining the number of layers in which the aperture width is made smaller.

Also in the present embodiment, all the layers constituting the support member are positioned under the electrode terminal connecting parts, thereby securing planarity of the bump connecting surface of the support member and improving connectivity of the electrode terminals. p (Embodiment 6)

Figure 13:
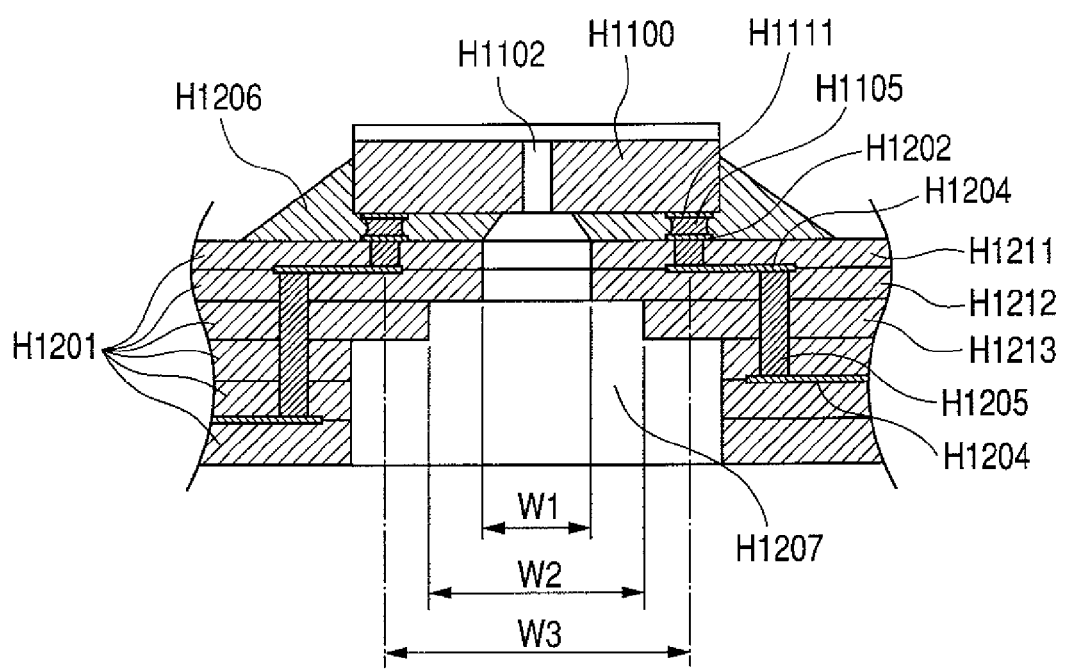
FIG. 13 illustrates an embodiment 6 of the recording head of the present invention, and is a cross-sectional view showing the support member with internally structured wiring in a vicinity of a liquid supply opening for supplying the liquid discharge substrate with a recording liquid.

FIG. 13 illustrates an embodiment 6 of the recording head of the present invention, and is a cross-sectional view showing the support member with internally structured wiring in a vicinity of a liquid supply opening for supplying the liquid discharge substrate with a recording liquid.

In the foregoing embodiments 4 and 5, the aperture width of the liquid supply opening is made smaller for several layers from the uppermost layer of the support member with internally structured wiring, but is made larger in the underlying layers. Also in such underlying layers, the aperture width is made smaller than the distance between the electrode terminal connecting parts.

In the present embodiment, in contrast, the aperture width is made smaller as W1 for the uppermost two layers (or one layer or several layers) then made as W2 smaller than the distance W3 between the electrode terminal connecting parts in an adjacent layer only, and made larger than the distance W3 in the subsequent underlying layers.

In connecting the rear surface electrode terminals H1111 of the liquid discharge substrate H1100 and the surface electrode terminals H1201 of the support member with the bumps H1105, it is only required to secure the connectivity of the electrode terminals. It is therefore not necessarily essential to maintain the aperture width of the liquid supply opening smaller than the distance of the electrode terminal connecting parts, in all the layers under the uppermost layer. In the present embodiment, the aperture width W2 is formed only in one layer under the uppermost two layers, but the number of such layer may be determined according to the planarity of the bump connecting surface of the support member.

In the present embodiment, the aperture width of the liquid supply opening in the lower layers can be made even larger than in the embodiments 4 and 5, thereby further facilitating the working of the liquid supply opening in the support member and reducing the manufacturing cost. Also the supply property of the recording liquid can be further improved.

(Embodiment 7)

Figure 14:
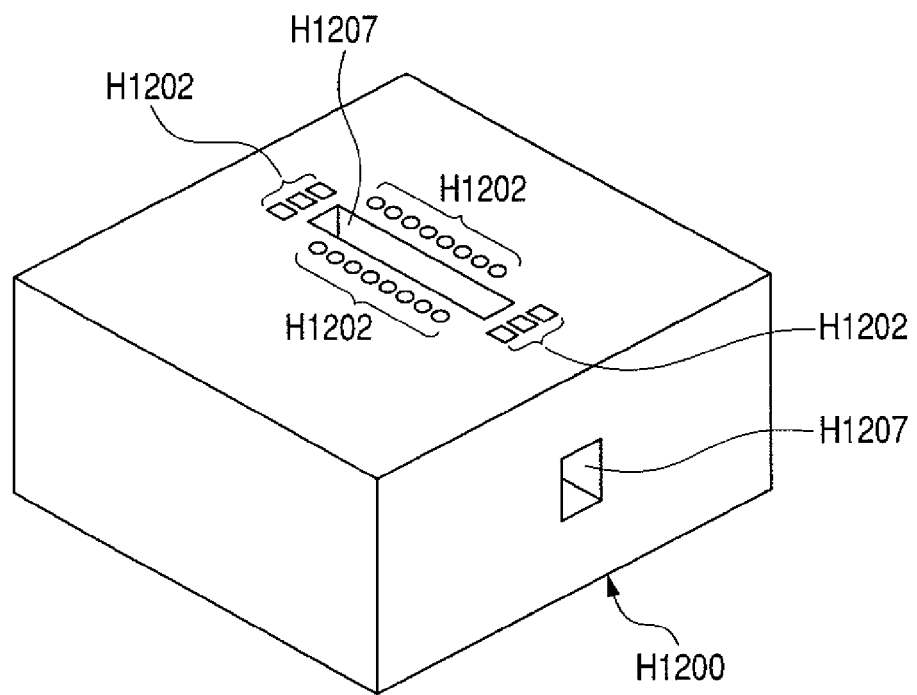
FIG. 14 is an external perspective view showing, in an embodiment 7 of the recording head of the present invention, a liquid supply opening formed in the support member with internally structured wiring.

FIG. 14 is an external perspective view showing, in an embodiment 7 of the recording head of the present invention, a liquid supply opening formed in the support member with internally structured wiring.

In the embodiments explained above, the liquid supply opening H1207 in the support member H1200 with internally structured wiring penetrates from the top surface to the rear surface.

On the other hand, in the present embodiment, the liquid supply opening H1207 in the support member H1200 with internally structured wiring penetrates from the top surface to a lateral surface. It is thus possible to change the flowing direction of the recording liquid. Also the positional relationship can be changed between the liquid discharge substrate H1100 and the ink supply member H1300, thus increasing freedom in designing.

(Embodiment 8)

Figure 15:
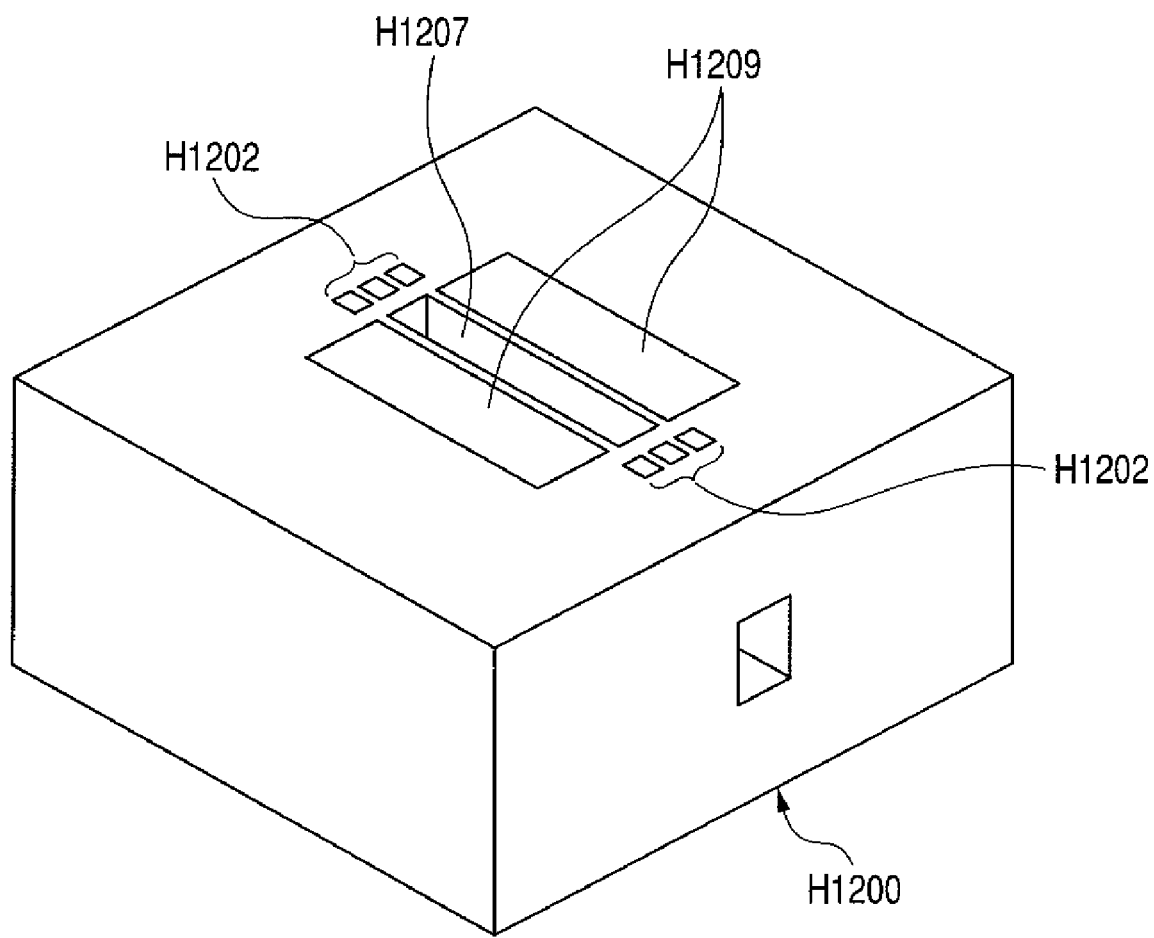
FIG. 15 is an external perspective view showing, in an embodiment 8 of the recording head of the present invention, a heat dissipating member formed in the support member with internally structured wiring.

FIG. 15 is an external perspective view showing, in an embodiment 8 of the recording head of the present invention, a heat dissipating member formed on the support member with internally structured wiring.

The foregoing embodiments show structures in which the surface electrode terminals H1202, to be electrically connected with the electrode terminals provided on the top or rear surface of the liquid discharge substrate H1100, are positioned on the surface, for mounting the liquid discharge substrate, of the support member H1200 with internally structured wiring. In particular, the embodiment 1 explains that the rear surface electrode terminals H1111 formed on the rear surface of the liquid discharge substrate H1100 and the surface electrode terminals H1202 on the support member H1200 with internally structured wiring are electrically connected. It is also explained that such electrical connecting parts are used not only for transmitting the electrical signals but also for dissipating the heat, generated in the liquid discharge substrate H1100 by the discharge operation, to the support member with internally structured wiring.

The surface electrode terminals H1202 of the support member H1200 with internally structured wiring, for such heat dissipating purpose, need not be in individually independent form as in the embodiment 1 (see FIGS. 4 and 14), but may be formed in a continuously connected heat-dissipating pattern H1209 as shown in FIG. 15.

(Embodiment 9)

Figure 16:
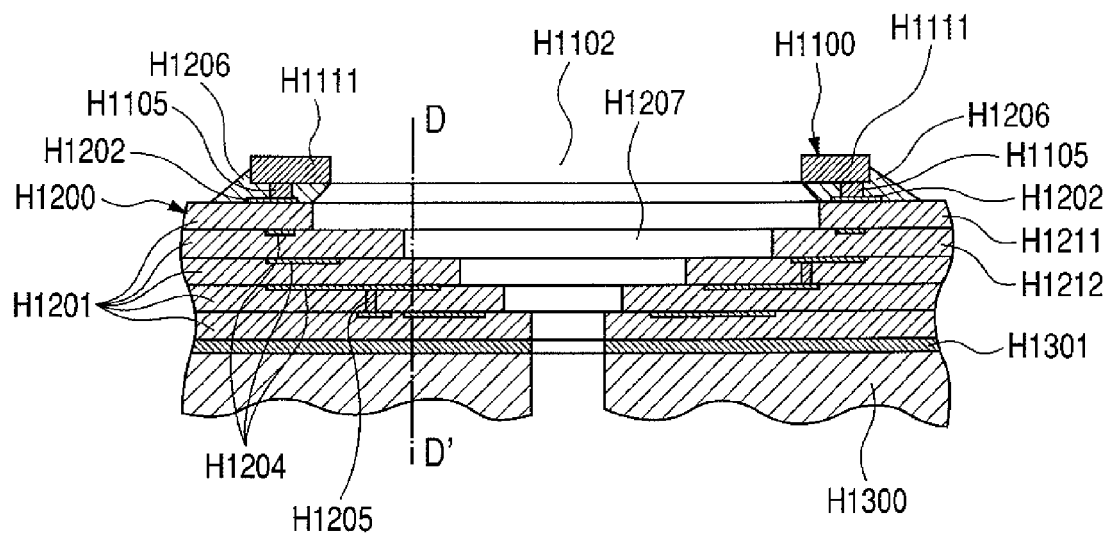
FIG. 16 illustrates an embodiment 9 of the recording head of the present invention, and is a cross-sectional view showing the support member with internally structured wiring along the longitudinal direction of the liquid discharge substrate.

FIG. 16 illustrates an embodiment 9 of the recording head of the present invention, and is a cross-sectional view showing the support member with internally structured wiring along the longitudinal direction of the liquid discharge substrate. FIG. 16 corresponds to a cross section along a line C-C' in FIG. 5. Also FIG. 17 shows a cross section along a line D-D' in FIG. 16.

In the present embodiment, as shown in FIG. 16, the aperture width of the liquid supply opening H1207 becomes smaller from the uppermost ceramic sheet H1201 in the support member 1200 with internally structured wiring toward the lower layers therein. Such form is similar to the embodiment 3 shown in FIG. 10.

Figure 17:
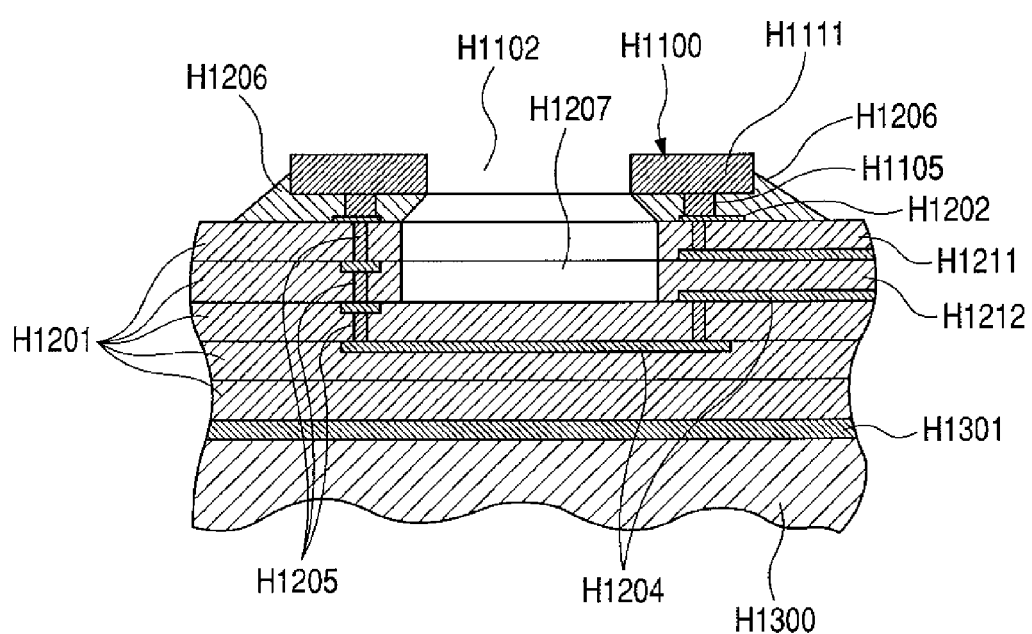
FIG. 17 is a cross-sectional view along a line D-D' in FIG. 16.

FIG. 17 shows a cross section in the vicinity of an end portion of such tapered liquid supply opening H1207. In a position shown in FIG. 17, the aperture of the liquid supply opening H1207 is formed in the uppermost first layer H1211 and the second layer H1212 of the ceramic sheets, but is not formed in the underlying ceramic sheets H1201. In the present embodiment, an internal conductive wiring H1204 is formed between the ceramic sheets H1201 lower than the second layer H1212, so as to cross a projected area of the liquid supply aperture in the upper layers. It is therefore possible to provide the internal conductive wiring H1204 from a side to the other side of the liquid supply opening H1207 (in a direction perpendicular to the plane of FIG. 16), under the aperture of the liquid supply opening H1207 formed in the first layer H1211 and second layer H1212 of the ceramic sheets H1201.

In such embodiment, the internal wiring need not be formed, as in the prior technology, detouring the liquid supply opening H1207, for supplying the liquid supply substrate H1100 with the recording liquid, so that the surface area of the support member, seen from above, can be made smaller. Therefore, the recording head can be made more compact.

(Embodiment 10)

Figure 18:
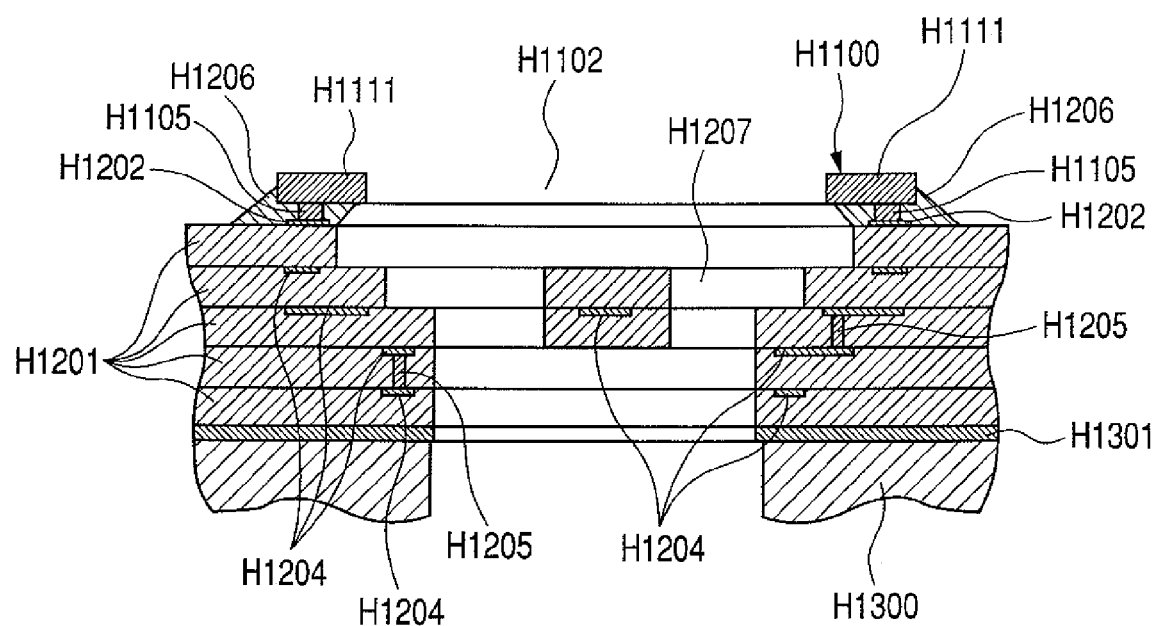
FIG. 18 illustrates an embodiment 10 of the recording head of the present invention, and is a cross-sectional view showing the support member with internally structured wiring along the longitudinal direction of the liquid discharge substrate.

FIG. 18 illustrates an embodiment 10 of the recording head of the present invention, and is a cross-sectional view showing the support member with internally structured wiring along the longitudinal direction of the liquid discharge substrate. FIG. 18 corresponds to a cross section along a line C-C' in FIG. 5.

In the foregoing embodiment 9, the liquid supply opening H1207 in the support member H1200 has a tapered structure becoming finer as the distance from the support surface of the liquid discharge substrate H1100 increases. Also there is shown a method of providing the internal conductive wiring H1204 so as to be positioned under the liquid supply opening formed in the ceramic sheets H1201 of the upper layers.

In addition, it is also possible, as shown in FIG. 18, to form a beam structure by a ceramic sheet, in the liquid supply opening H1207 of the support member H1200 and to position an internal conductive wiring H1204 so as to cross the liquid supply opening H1207 through such beam. FIG. 18 shows a structure with a single beam, but the beam may be easily formed in plural units, thereby increasing freedom of electrical wirings in the support member H1200.

(Embodiment 11)

Figure 19:
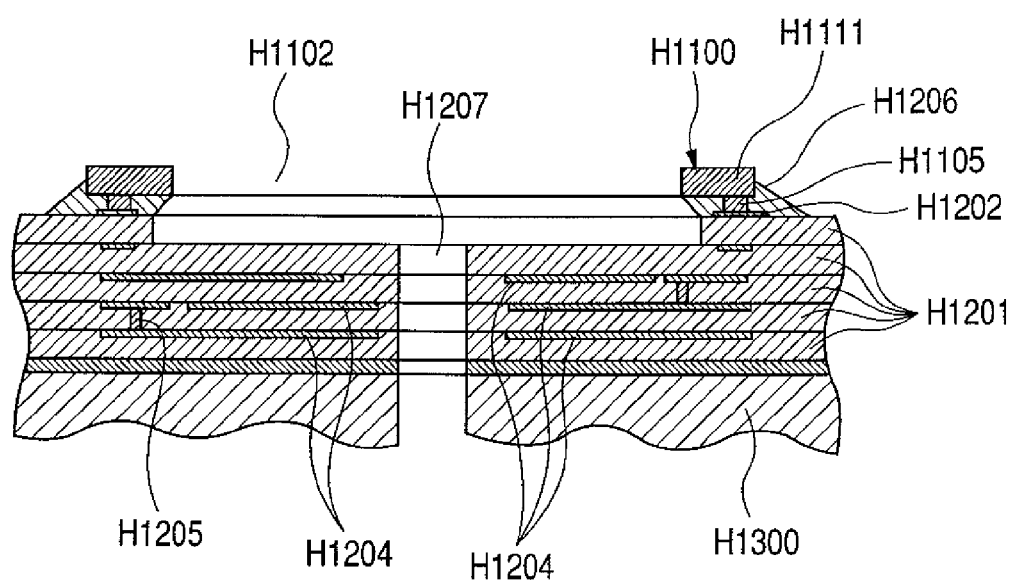
FIG. 19 illustrates an embodiment 11 of the recording head of the present invention, and is a cross-sectional view showing the support member with internally structured wiring along the longitudinal direction of the liquid discharge substrate.

FIG. 19 illustrates an embodiment 11 of the recording head of the present invention, and is a cross-sectional view showing the support member with internally structured wiring along the longitudinal direction of the liquid discharge substrate. FIG. 19 corresponds to a cross section along a line C-C' in FIG. 5.

In the foregoing embodiments 9 and 10, the liquid supply opening H1207 of the support member H1200 is formed in a tapered shape. On the other hand, it is also advantageous, as in the present embodiment shown in FIG. 19, to form the aperture of the liquid supply opening in the support member H1200, smaller in the layers under the second ceramic sheet H1201, thereby securing an area for providing the electrical wirings.

The embodiments 9 to 11 explained above provide following effects. As the electrical wiring formed in the interior of the support member can be positioned inside the projected area of the liquid supply opening on the outermost surface of the support member, whereby the area of the support member, seen from above, can be made significantly smaller in comparison with a structure in which the electrical wiring is positioned outside the projected area of the liquid discharge opening. Thus the recording head can be made smaller.

(Embodiment 12)

Figure 20:
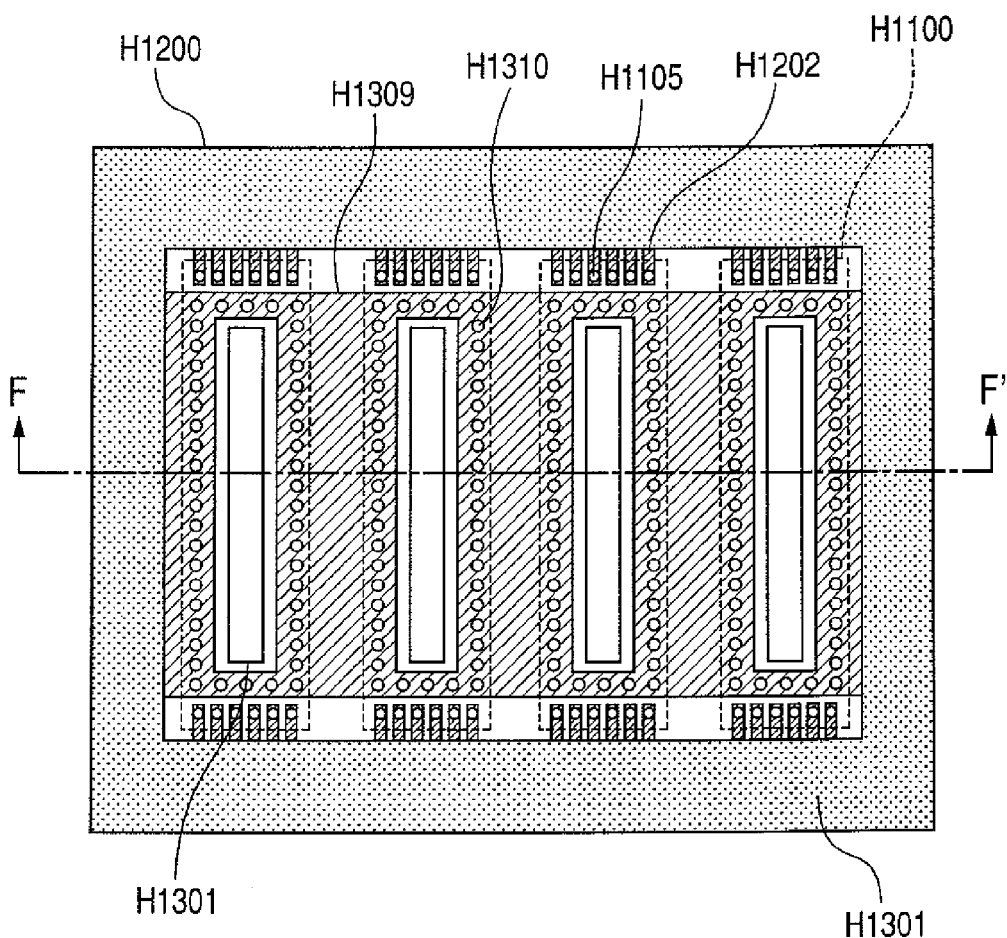
FIG. 20 is a schematic plan view showing a principal part of the recording head of the present invention, in an embodiment 12.
Figure 21:
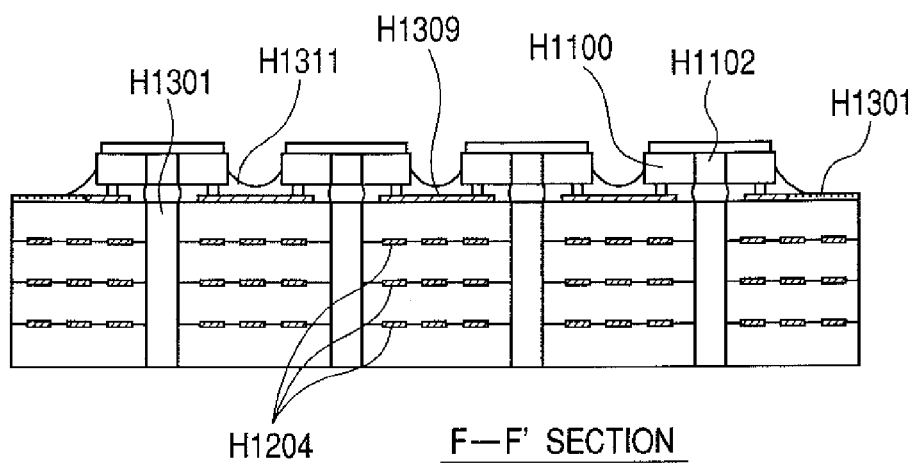
FIG. 21 is a schematic cross-sectional view along a line F-F' in FIG. 20.
Figure 22:
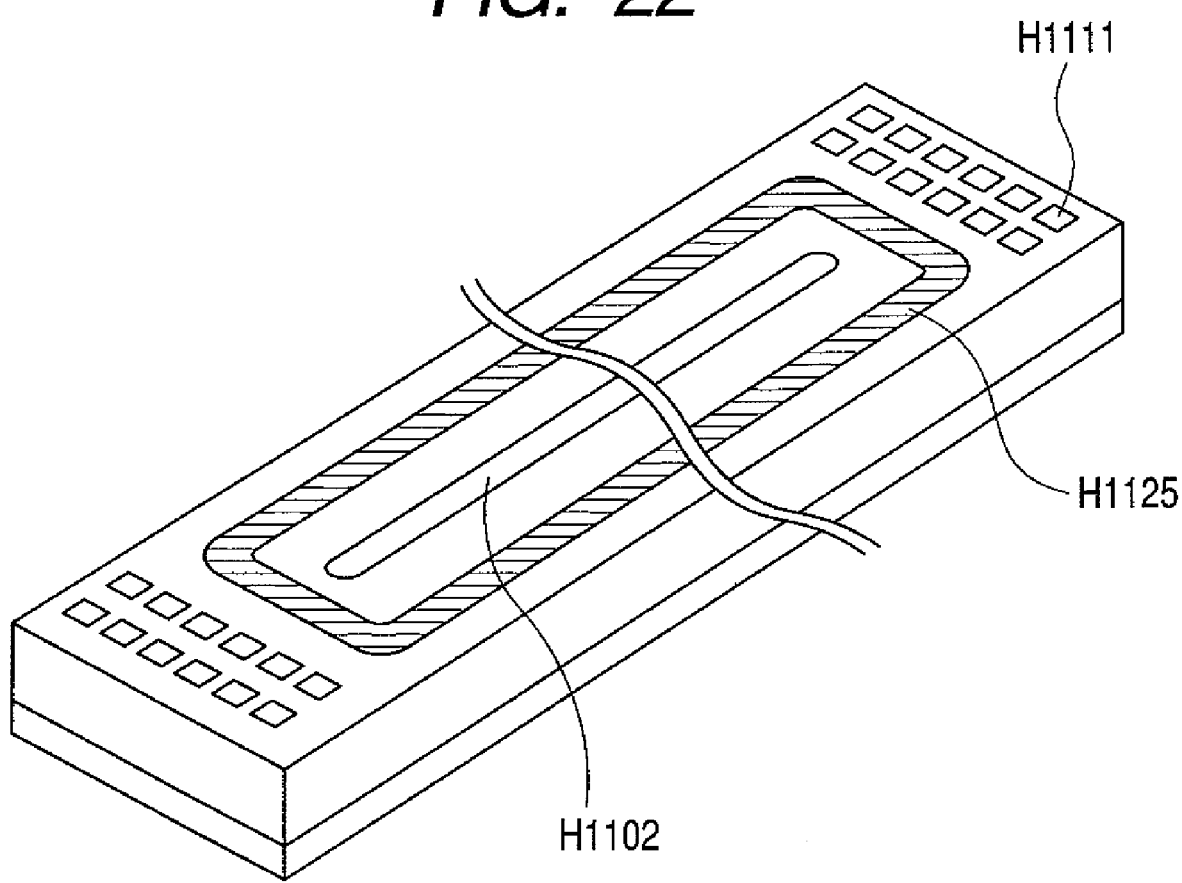
FIG. 22 is a perspective view showing a rear side of the liquid discharge substrate shown in FIG. 3.

FIG. 20 is a schematic plan view showing a principal part of the recording head of the present invention, in an embodiment 12; FIG. 21 is a schematic cross-sectional view along a line F-F' in FIG. 20; and FIG. 22 is a perspective view showing a rear side of the liquid discharge substrate shown in FIG. 3.

The foregoing embodiments show a structure of mounting a liquid discharge substrate in a single recording head, but the present embodiment has a structure of mounting plural liquid discharge substrates in a single recording head, thereby enabling a multi-color recording with a recording head. For such multi-color recording, plural ink tanks are mounted on the single recording head. The recording head of the present embodiment can mount, as shown in FIG. 20, four liquid discharge substrates H1100.

As shown in FIGS. 20 and 21, a support member (laminated ceramic substrate) H1200 with internally structured wiring is provided under liquid discharge substrates H1100, indicated by broken lines. Also electrical bump H1105 are provided on electrode terminals H1205, formed on a surface of the support member H1200 with internally structured wiring, for mounting the liquid discharge substrates H1100.

On the other hand, the liquid discharge substrate H1100 is provided, on the rear surface thereof, with plural rear surface electrode terminals H1111 for transmitting electrical signals to electrical circuits (such as electrothermal converting elements) on the top surface of the liquid discharge substrate H1100. The rear surface electrode terminals H1111 are connected with the electrical circuits on the top side of the liquid discharge substrate H1100 through unillustrated penetrating wirings through the liquid discharge substrate.

Electrical connections are made by adjoining the electrical bumps H1105 shown in FIG. 20 with the rear surface electrode terminals H1111 shown in FIG. 22, whereby an electrical power and electric signals, necessary for discharging the recording liquid, are supplied from the support member H1200 with internally structured wiring to the liquid discharge substrates H1100. The electrical connection by the electrical bump is sealed by a sealant (or adhesive) H1311, and is protected from an erosion by the recording liquid and from an external impact.

In FIG. 22, a hatched area on the rear side of the liquid discharge substrate H1100 indicates a heat-dissipating bump adjoining part H1125. In such part heat-dissipating bumps H1310 are formed for dissipating the heat of the liquid discharge substrate H1100, through a heat-dissipating conductor layer (metal foil) H1309 to the support member H1200 with internally structured wiring. The heat-dissipating bumps H1310 are provided for heat transmission and do not execute an electrical connection, but may also be used as an electrical grounding wiring.

Also the heat-dissipating conductor layer H1309 is formed wider than a projected area of the liquid discharge opening H21100 onto the support member H1200 with internally structured wiring. Such structure allows to spread the heat from the liquid discharge substrate H1100 on the heat-dissipating conductor layer H1309, thereby achieving a recording head with a satisfactory heat-dissipating property. The heat-dissipating bumps H1310 are so formed, as explained above, as to correspond to the heat-dissipating bump adjoining part H1125 of the liquid discharge substrate H1100. The present embodiment employs heat-dissipating bumps, but such structure is not restrictive and there may also be employed any material with satisfactory thermal conductivity such as a solder or a conductive paste. It is also possible to form a plated bump on the rear surface of the liquid discharge substrate H1100. Also the present embodiment employs tens to hundreds of heat-dissipating bumps per a liquid discharge substrate, each having a diameter of tens to hundreds of micrometers. However the number of the heat-dissipating bumps is not limited to such example, but can be arbitrarily selected according to a heat amount generated in the liquid discharge substrate, required heat-dissipating characteristics, and a contact area (bump diameter) per bump.

Also in the present embodiment, the adjoining between the rear surface electrode terminals H1111 of the liquid discharge substrate H1100 and the electrode terminals H1202 of the support member H1200 with internally structured wiring is executed by the electric bumps H1105. However, it is also possible to employ an adjoining with a conductive adhesive material, or a method of mutually contacting the electrodes by a thermosetting adhesive. Also the thermosetting adhesive may contain conductive particles.

The support member H1200 with internally structured wiring is constituted of alumina ($Al_2O_3$) in the present embodiment, and has a thickness of about 0.5 to 10 mm in the entire laminated structure. However the material is not limited to alumina but may be formed by a material having a linear expansion coefficient similar to that of the material constituting the liquid discharge substrate and showing a satisfactory thermal conductivity, such as silicon (Si), aluminum nitride (AlN), zirconia, silicon nitride ($Si_3N_4$), or silicon carbide (SiC). Also the internal wiring conductor H1204 in the support member H1200 with internally structured wiring may be formed by silver (Ag), copper (Cu), molybdenum (Mo), tungsten (W) or gold (Au).

Features of the present embodiment will be explained further with reference to the accompanying drawings.

Figure 23:
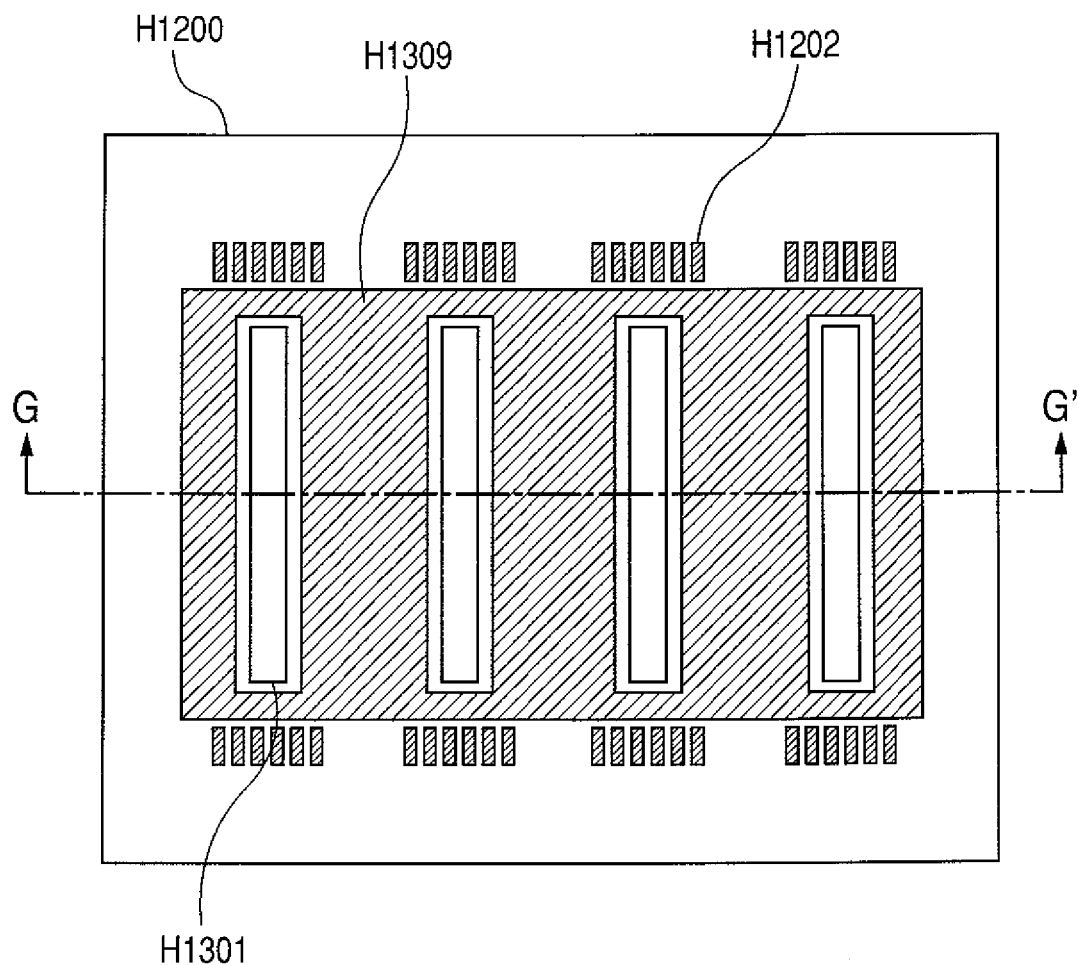
FIG. 23 is a schematic plan view showing only the support member with internally structured wiring, in the recording head shown in FIG. 20, in a state where an overcoat layer is eliminated.
Figure 24:
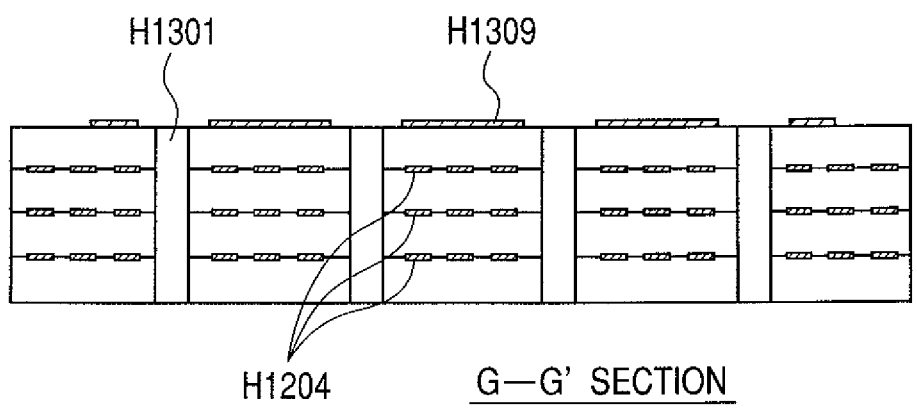
FIG. 24 is a schematic cross-sectional view along a line G-G' in FIG. 23.

FIG. 23 is a schematic plan view showing only the support member with internally structured wiring, in the recording head shown in FIG. 20, in a state where an overcoat layer is eliminated, and FIG. 24 is a schematic cross-sectional view along a line G-G' in FIG. 23.

As shown in FIGS. 23 and 24, conductors present on the surface of the support member H1200 with internally structured wiring for supporting the liquid discharge substrate are limited to the electrode terminals H1202, unillustrated through-holes and the heat-dissipating conductor layer H1309. As no other conductors are provided, the surface remains flat without the irregularities of wirings, so that an overcoat layer H1301 can be formed thereon in a flat state without surface irregularities. Therefore, in a capping operation with a rubber cap of the main body of the recording apparatus, the cap can closely contact the support member H1200 with internally structured wiring, without causing a leak. As a result, there can be provided a recording head capable of a stable capping operation, without causing a suction failure at the cleaning operation or an insufficient humidity maintenance in a standby state.

Also the surface has the electrode terminals H1202 and the heat-dissipating conductive layer H1309 only around the penetrating hole H1301, communicating with the liquid supply opening H1102 of the liquid discharge substrate H1100, and does not have any other connecting wirings thereon. Therefore, there can be provided a recording head, which does not cause an electrical shortcircuiting or an erosion of the wiring layer by ink deposited in a wiping operation, even if the overcoat layer H1301 contains a pinhole. Also the overcoat layer may be dispensed with, in case the electrode terminals H1202 and the heat-dissipating conductor layer H1309 can be entirely covered with the adhesive or sealant H1311, provided between the liquid discharge substrate H1100 and the support member H1200 with internally structured wiring.

In the present invention, the electrical circuits such as electrothermal converting elements, provided on the surface of the liquid discharge substrate H1100, are connected, through unillustrated penetrating electrodes through the liquid discharge substrate H1100, to the rear surface electrode terminals H1111, which are electrically connected, by the electric bumps H1105, with the electrode terminals H1202 provided on the mounting surface, for mounting the liquid discharge substrate, of the support member H1200 with internally structured wiring. The wirings from the electrode terminals H1202 are connected, by unillustrated through-holes provided in the vicinity of the electrode terminals, to the internal conductive wirings H1204 formed in the internal layers of the support member H1200. The internal conductive wirings H1204 are formed not only in areas below the vicinity of the electrode terminals H1202, but also between the penetrating holes H1301 for supplying the liquid discharge substrate with the recording liquid.

Such connection of the electrical circuits, on the surface of the liquid discharge substrate H1100, to the wirings in the support member H1200 positioned behind the liquid discharge substrate can reduce the wirings on the surface of the liquid discharge substrate, whereby the recording head can be realized more compactly.

Also, the heat-dissipating conductor layer H1309, being so formed as to surround the penetrating hole H1301, can efficiently transmit the heat generated in the liquid discharge substrate H1100 to the support member H1200 with internally structured wiring, thereby providing a recording head with excellent heat-dissipating property.

The structure of the present embodiment explained above allows to provide a compact recording head, capable of a stable capping operation and of a reliable ink resistance.

The present embodiment shows a structure of mounting plural liquid discharge substrates H1100, each having a single liquid supply opening, on a support member H1200 with internally structured wiring. In such structure, in order to realize recording of a higher image quality, a very high relative positional precision is required among the discharge ports of the liquid discharge substrates. Therefore, the liquid discharge substrate of the present invention may include discharge port arrays and liquid supply openings for different colors on a single liquid discharge substrate H1100. The embodiments explained above are likewise applicable to such liquid discharge substrate having plural liquid supply openings, with similar effects.

The embodiments 1 to 12 explained above provide following effects:

1) Improvement in Heat-Dissipating Property

The support member with internally structured wiring can have an increased heat capacity, by forming metal pattern layers, having a larger heat capacity than in ceramics, between the laminated ceramic sheets. It can therefore absorb more quickly the heat generated in the liquid discharge substrate, thereby improving the heat-dissipating property.

2) Improvement in Connectivity of Electrode Terminals

The bump connected parts (electrode terminal connecting parts) between the rear surface electrode terminals H1111 of the liquid discharge substrate and the surface electrode terminals H1202 of the support member are positioned outside the liquid supply opening at least in the first layer H1211 and the second layer H1212 of the support member. Therefore the support member can secure the planarity of the bump connecting surface, thereby improving the connectivity of the electrode terminals.

3) Reduction in Manufacturing Cost

The support member with internally structured wiring is prepared by the ceramic green sheet method, so that a support member having a liquid supply opening matching the size of a compact liquid discharge substrate can be realized relatively inexpensively with a simple process. Also the support member with internally structured wiring serves not only as a supporting member for the liquid discharge substrate but also as a component for supplying the liquid discharge substrate with a driving power and drive signals. Therefore, the prior electric wiring board, electrically connected with the liquid discharge substrate for supplying a driving power and drive signals can be dispensed with. Therefore, the manufacturing cost of the recording head can be reduced, in terms of reduction of a number of components and reduction in the component connecting steps.

4) Maintaining Supply Performance for Recording Liquid

With a size reduction in the liquid discharge substrate, a matching liquid supply opening has to be formed also in the supporting substrate. However, a smaller width of the liquid supply opening increases the flow resistance to the recording liquid flowing therein, thus deteriorating the supply performance thereto. Nevertheless, as the support member with internally structured wiring of the present invention is formed by laminating ceramic sheets, a liquid supply opening, matching the liquid supply opening H1102 of the compacter liquid discharge substrate, is required only in the uppermost ceramic sheet, supporting the liquid discharge substrate. The width of the liquid supply opening may be made larger in the ceramic sheets under the uppermost one, thereby reducing the flow resistance to the recording liquid flowing in the liquid supply opening of the support member and thus improving the supply performance for the recording liquid.

5) Improvement in Reliability in Protection of Electric Wirings from Recording Liquid Ceramics employed in the support member with internally structured wiring (for example alumina) are chemically very stable, and wirings can be formed inside such dense ceramics. Therefore the wirings cannot be attacked by the recording liquid, and are improved in erosion resistance and humidity resistance, even when the liquid supply opening is positioned close to the electrical wirings, thus reducing the protection area by the sealant. In addition to such excellent performances, the liquid supply opening is formed, on the supporting surface of the support member for the liquid discharge substrate, inside the electrode terminal connecting parts, thereby expanding the protection area for the sealant and improving the reliability in protection of the electric wirings from the recording liquid.

6) Satisfactory Electrical Connection Between Liquid Discharge Substrate and Support Member The surface electrode terminals are positioned outside the liquid supply opening, formed on the outermost ceramic sheet of the support member, constituting the supporting surface for the liquid discharge substrate. Also the surface electrode terminals are so positioned outside the liquid supply opening, formed in the outermost ceramic sheet and in at least a ceramic sheet under such outermost ceramic sheet. Therefore, the electric connecting parts between the support member and the liquid discharge substrate are supported in areas including two or more thin ceramic sheets, which are employed for facilitating via hole formation for the penetrating electrode. Therefore, according to the present invention, in mounting the liquid discharge substrate on the support member, a load acting on the connecting parts between the rear surface electrode terminals of the liquid discharge substrate and the surface electrode terminals of the support member can be borne by a laminated structure of ceramic sheets.

(Embodiment 13)

Figure 25:
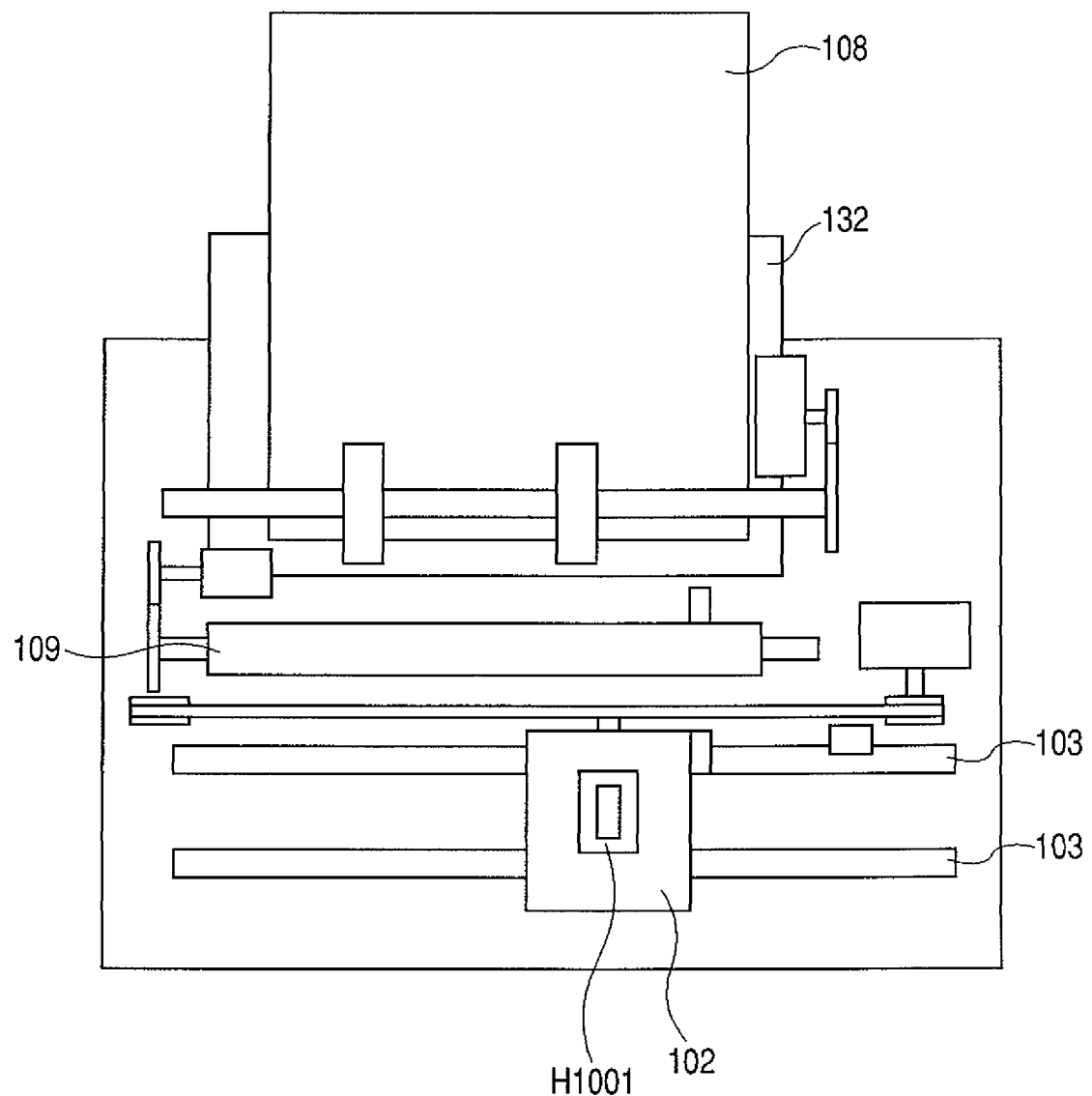
FIG. 25 is a schematic view showing a recording apparatus capable of mounting the ink jet recording head of the present invention.
Figure 26:
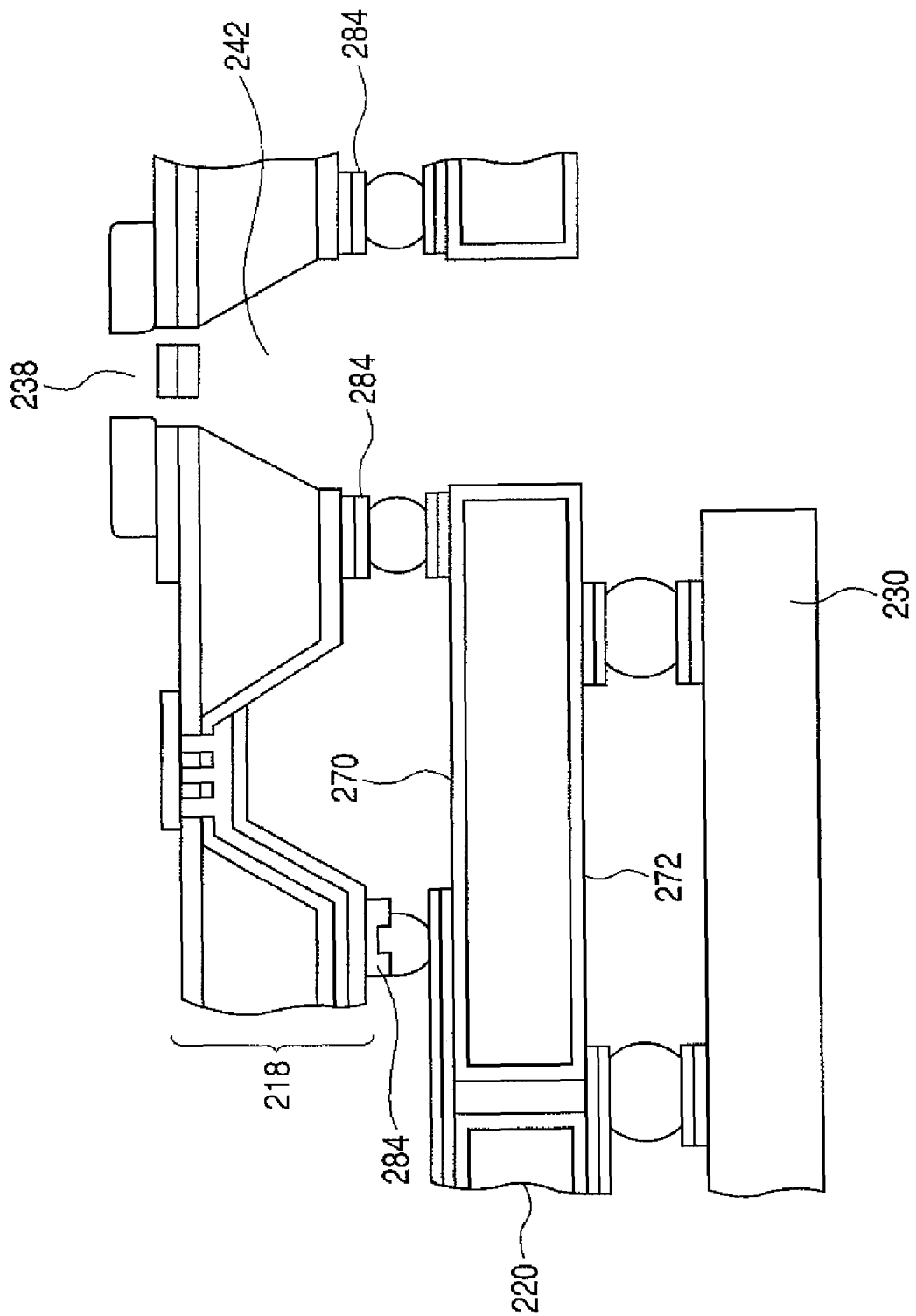
FIG. 26 is a schematic cross-sectional view showing a structure of a prior recording head.

In the following, as an embodiment 13 of the present invention, there will be explained a liquid discharge recording apparatus capable of mounting a recording head according to the embodiments 1 to 12 explained in the foregoing. FIG. 25 is a schematic view showing an example of the recording apparatus capable mounting the ink jet recording head of the present invention.

In the recording apparatus shown in FIG. 25, a recording head H1001 of the above-described embodiments is replaceably positioned and mounted on a carriage 102. The carriage 102 is equipped with an electrical connection part (not shown), for transmitting drive signals to the discharge port arrays through the electrical connection part on the recording head H1001.

The carriage 102 is slidably supported and guided by a guide shaft 103, extended in a main scanning direction in the main body of the apparatus.

In a home position of the carriage, there is provided a cap (not shown) for capping a front face, containing the ink discharge ports, of the recording head H1001. The cap is used for executing a suction recovery operation, for recovering and maintaining the ink discharge performance of the recording head H1001. In the vicinity of the cap, a cleaning blade (not shown) is provided for wiping the face, containing the ink discharge ports, of the recording head H1001, thereby removing ink and the like attached thereon.

A recording medium 108 such as a recording paper or a thin plastic sheet is separated and fed one by one from an automatic sheet feeder (hereinafter represented as ASF), and is conveyed (sub scanning) through a position (recording position) opposed to the face, containing the ink discharge ports, of the recording head H1001.

The recording medium 108 is supported, at the recording position, on the rear surface by a platen (not shown). The recording head H1001 mounted on the carriage 102 is so supported that the face thereof, containing the ink discharge ports, protrudes downwards from the carriage 102 and becomes parallel to the recording medium 108 between two pairs of conveying rollers at the upstream and downstream sides.

The recording head H1001 is mounted on the carriage 102 in such a manner that a direction of array of the discharge ports in each discharge port array crosses the scanning direction of the carriage 102, and liquids are discharged from such discharge port arrays to execute a recording operation.

The foregoing embodiments utilize electrothermal converting elements for generating thermal energy in order to discharge the ink by such thermal energy, but the present invention is naturally applicable to other methods such as a method of ink discharge by a vibrating element.

Also the present invention is applicable not only to an ordinary printer, but also to an apparatus such as a copying machine, a facsimile apparatus having a communication system, or a word processor having a printing unit, and further to an industrial recording apparatus combined with various processing apparatuses.

This application claims priorities from Japanese Patent Application Nos. 2005-119556 filed on Apr. 18, 2005 and 2006-091012 filed on Mar. 29, 2006, which are incorporated hereinto by reference.

The invention claimed is:

1. A liquid discharge head comprising:
   a substrate having a liquid supply opening penetrating through a front surface and a back surface of the substrate to supply a liquid;
   energy generating means provided on the front surface of the substrate to generate energy for discharging the liquid;
   a first electrode terminal provided on the back surface of the substrate to supply the energy generating means with electric power and a drive signal;
   a support member formed at a plurality of stacked sheet members, the uppermost sheet member of the support member supporting the substrate from the back surface of the substrate, the sheet members each having a through-hole and an aperture, a liquid supply hole for supplying the liquid supply opening of the substrate with the liquid being formed by aligning the apertures of the sheet members,
   an electrical line having via holes each formed by filling an electrically conductive material in the through-holes penetrating the sheet members and conductive layers provided between adjacent sheet members, the electrical line being formed by connecting a plurality of the via holes and the conductive layers;
   a second electrode terminal provided on the uppermost sheet member of the support member so that the second electrode terminal is in contact with the electrical line, the second electrode terminal being positioned to have a space between the second electrode terminal and an edge of the aperture of the uppermost sheet member;
   an electrically conductive bump directly contacting the first electrode terminal and the second electrode terminal to electrically connect the first electrode terminal with the second electrode terminal; and
   a sealing agent filled between the substrate and the support member at least from a position where the bump is provided to the edge of the aperture of the uppermost sheet member of the support member.

2. A liquid discharge head according to claim 1, wherein the bump is provided between the substrate and the uppermost sheet member of the support member.

3. A liquid discharge head according to claim 1, further comprising a third terminal provided at a side surface or a rear surface of the support member and electrically connected with the second electrical terminal through the electrical line.

4. A liquid discharge head according to claim 1, wherein a plurality of liquid supply holes are provided and the electrical line is formed between adjacent liquid supply holes in a direction of a normal line of a surface of the support member.

5. A liquid discharge head according to claim 1, further comprising a heat dissipating conductive member provided on the surface of the support member to dissipate heat from the substrate.

6. A liquid discharge head according to claim 1, further comprising a penetrating electrode penetrating the substrate through the front surface and the back surface thereof to contact the first electrode terminal.

7. A liquid discharge head according to claim 1, wherein ink is discharged as the liquid.

8. A liquid discharge head according to claim 1, wherein the apertures of the stacked sheet members are of different sizes and an imaginary line extending vertically from the second electrode terminal does not pass through any of the apertures.

* * * * *